US012575453B2

(12) United States Patent
Arai et al.

(10) Patent No.: US 12,575,453 B2
(45) Date of Patent: Mar. 10, 2026

(54) SEMICONDUCTOR DEVICE

(71) Applicant: Kioxia Corporation, Tokyo (JP)

(72) Inventors: Shinya Arai, Yokkaichi (JP); Yuta Taguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 564 days.

(21) Appl. No.: 18/060,036

(22) Filed: Nov. 30, 2022

(65) Prior Publication Data

US 2023/0411328 A1 Dec. 21, 2023

(30) Foreign Application Priority Data

Jun. 20, 2022 (JP) ................................. 2022-099042

(51) Int. Cl.
H01L 23/538 (2006.01)
H01L 23/00 (2006.01)
H01L 25/065 (2023.01)

(52) U.S. Cl.
CPC .............. H01L 24/09 (2013.01); H01L 24/08 (2013.01); H01L 25/0657 (2013.01); *H01L 2224/0801* (2013.01); *H01L 2224/08055* (2013.01); *H01L 2224/08145* (2013.01); *H01L 2224/0903* (2013.01); *H01L 2224/09051* (2013.01); *H01L 2224/09132* (2013.01); *H01L 2224/09133* (2013.01); *H01L 2224/09179* (2013.01); *H01L 2224/09515* (2013.01); *H01L 2225/06524* (2013.01); *H01L 2225/06527* (2013.01); *H01L 2225/06541* (2013.01); *H01L 2225/06593* (2013.01); *H01L 2924/1431* (2013.01); *H01L 2924/1438* (2013.01); *H01L 2924/30205* (2013.01)

(58) Field of Classification Search
CPC ........... H01L 2224/08145; H01L 24/08; H01L 24/06; H01L 2224/80895
See application file for complete search history.

(56) References Cited

U.S. PATENT DOCUMENTS

| | | |
|---|---|---|
| 2020/0035737 A1 | 1/2020 | Ito et al. |
| 2020/0402562 A1* | 12/2020 | Li ........................... H10B 10/18 |
| 2021/0202458 A1 | 7/2021 | Jung et al. |
| 2021/0265314 A1 | 8/2021 | Arai |
| 2021/0320141 A1 | 10/2021 | Kotoo et al. |
| 2021/0384246 A1 | 12/2021 | Matsumoto |
| 2022/0013502 A1* | 1/2022 | Lee ..................... H01L 23/5385 |

FOREIGN PATENT DOCUMENTS

| | | |
|---|---|---|
| TW | 202027144 A | 7/2020 |

* cited by examiner

*Primary Examiner* — Antonio B Crite
*Assistant Examiner* — David J Goodwin
(74) *Attorney, Agent, or Firm* — Oblon, McClelland, Maier & Neustadt, L.L.P.

(57) ABSTRACT

According to an embodiment, a semiconductor device includes a first chip including a substrate, and a second chip bonded to the first chip at a first surface. Each of the first chip and the second chip includes an element region, and an end region including a chip end portion. The first chip includes a plurality of first electrodes that are arranged on the first surface in the end region and are in an electrically uncoupled state. The second chip includes a plurality of second electrodes that are arranged on the first surface in the end region, are in an electrically uncoupled state, and are respectively in contact with the first electrodes.

20 Claims, 26 Drawing Sheets

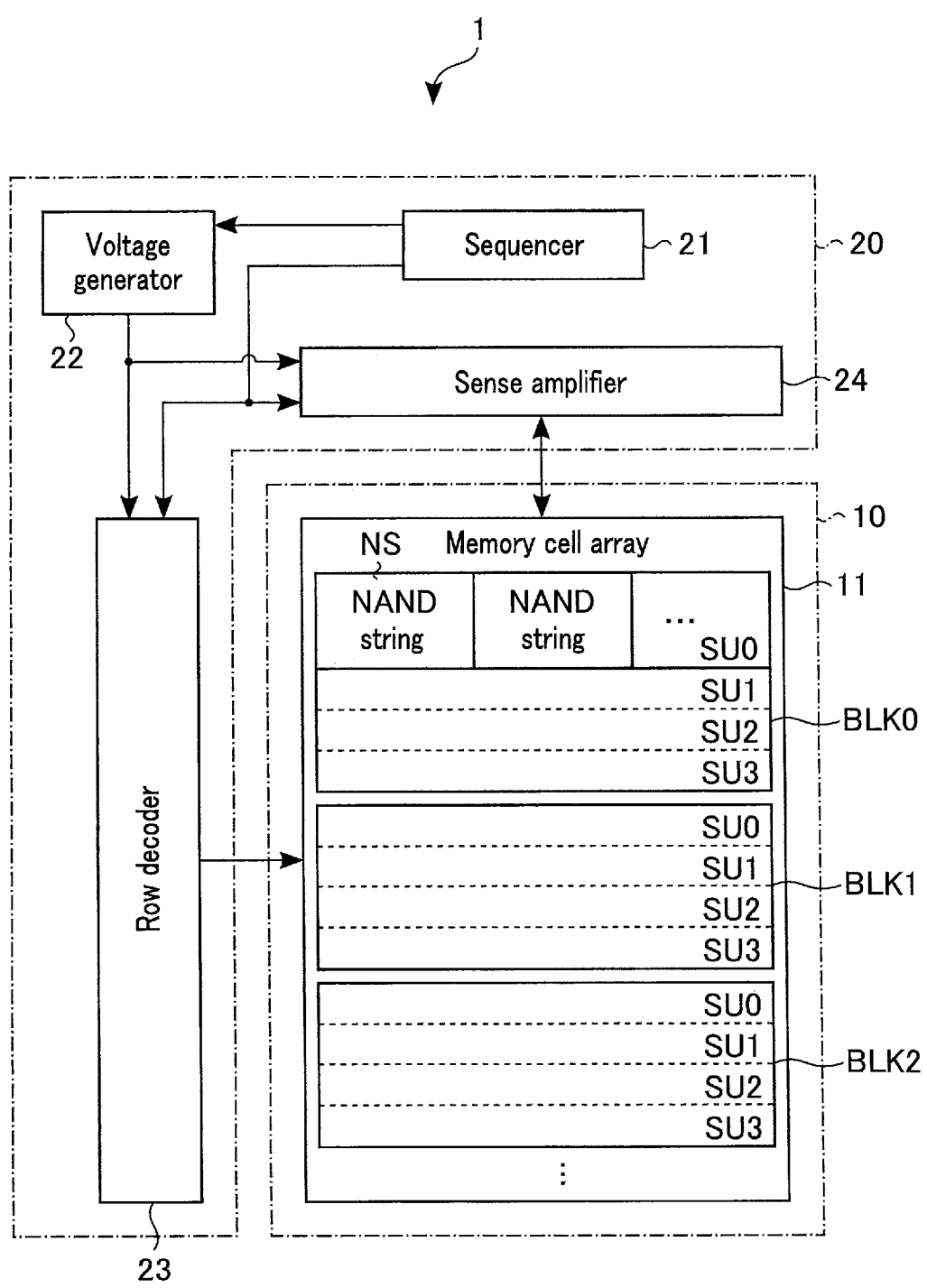
F I G. 1

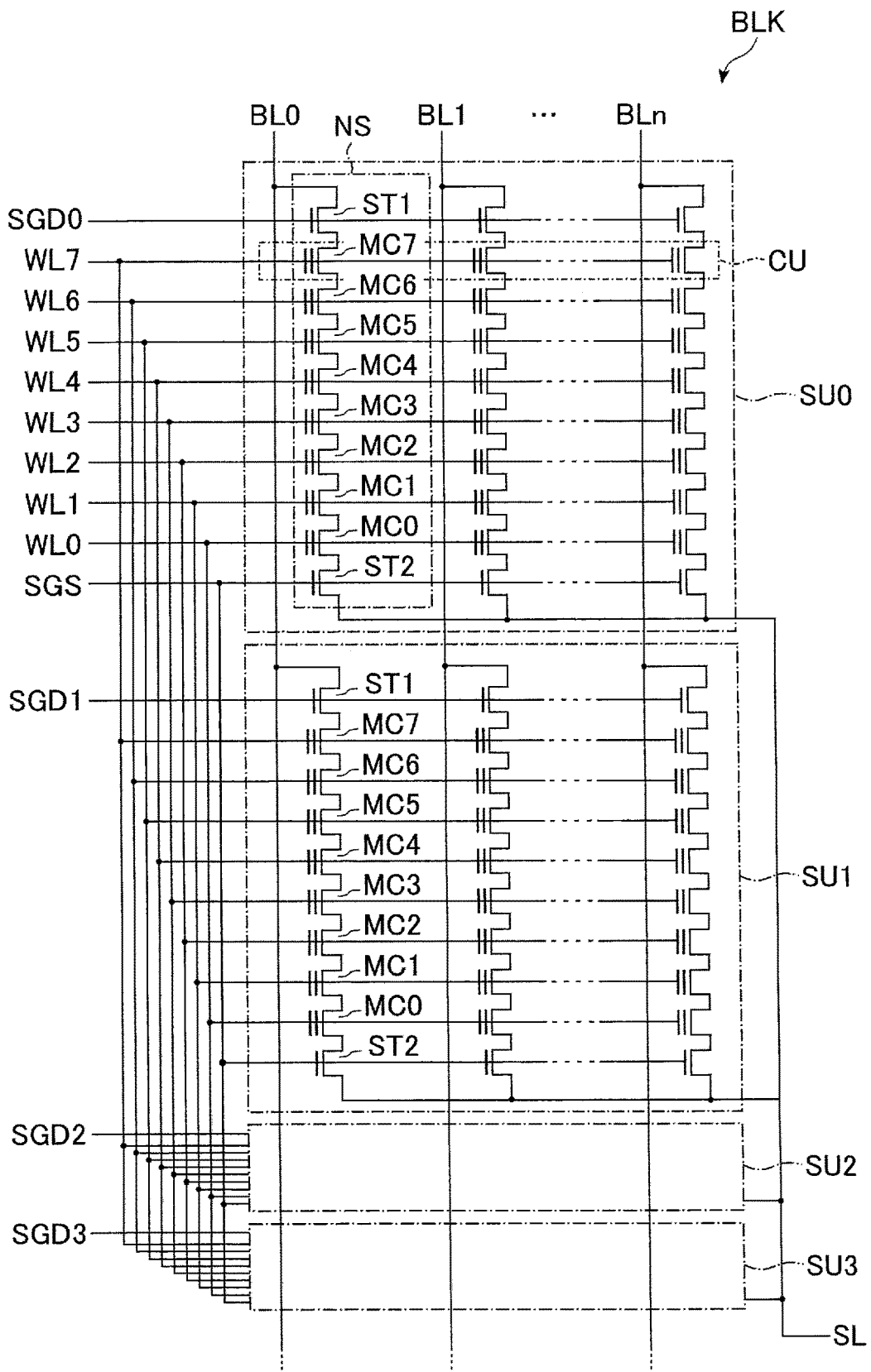
F I G. 2

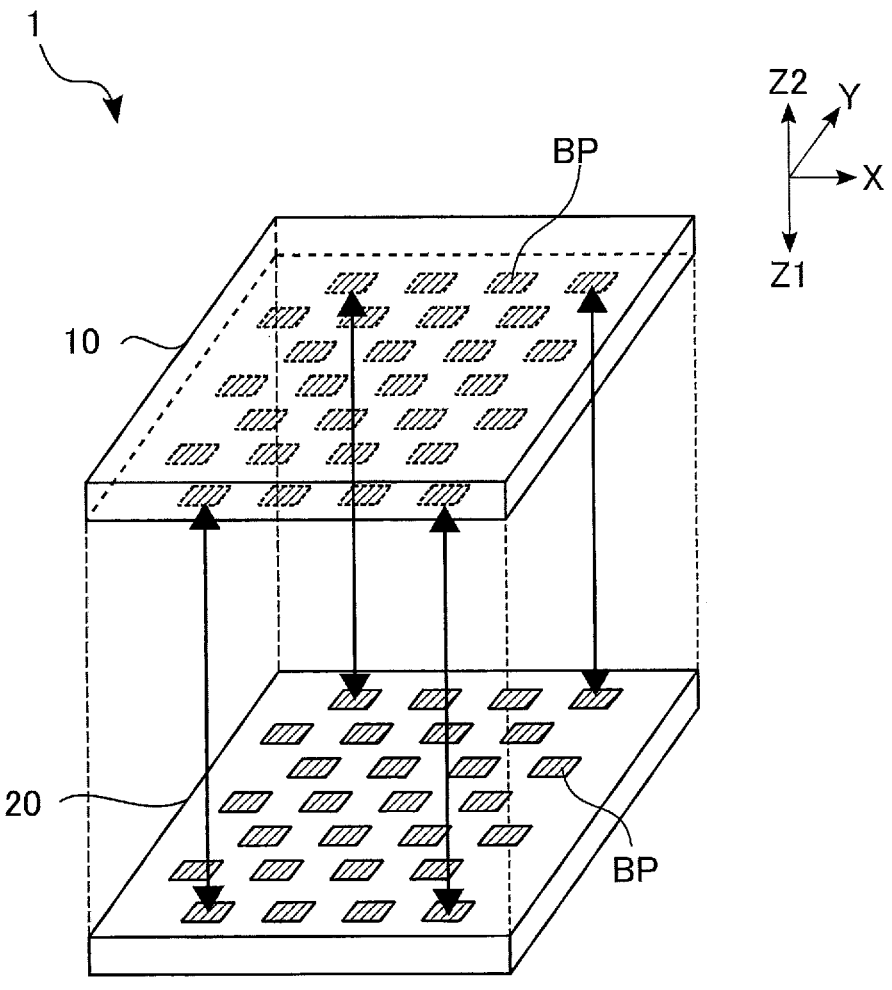
F I G. 3

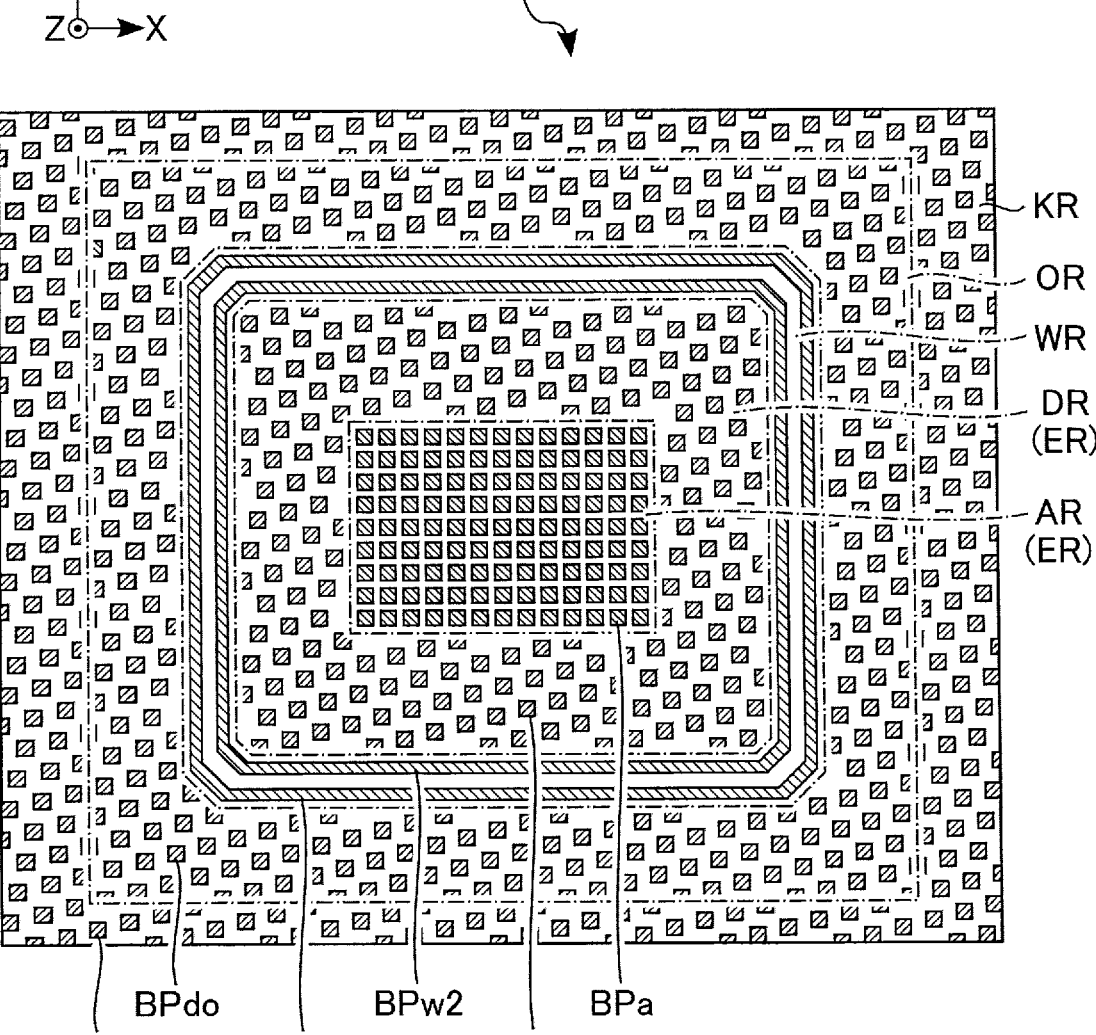
F I G. 5

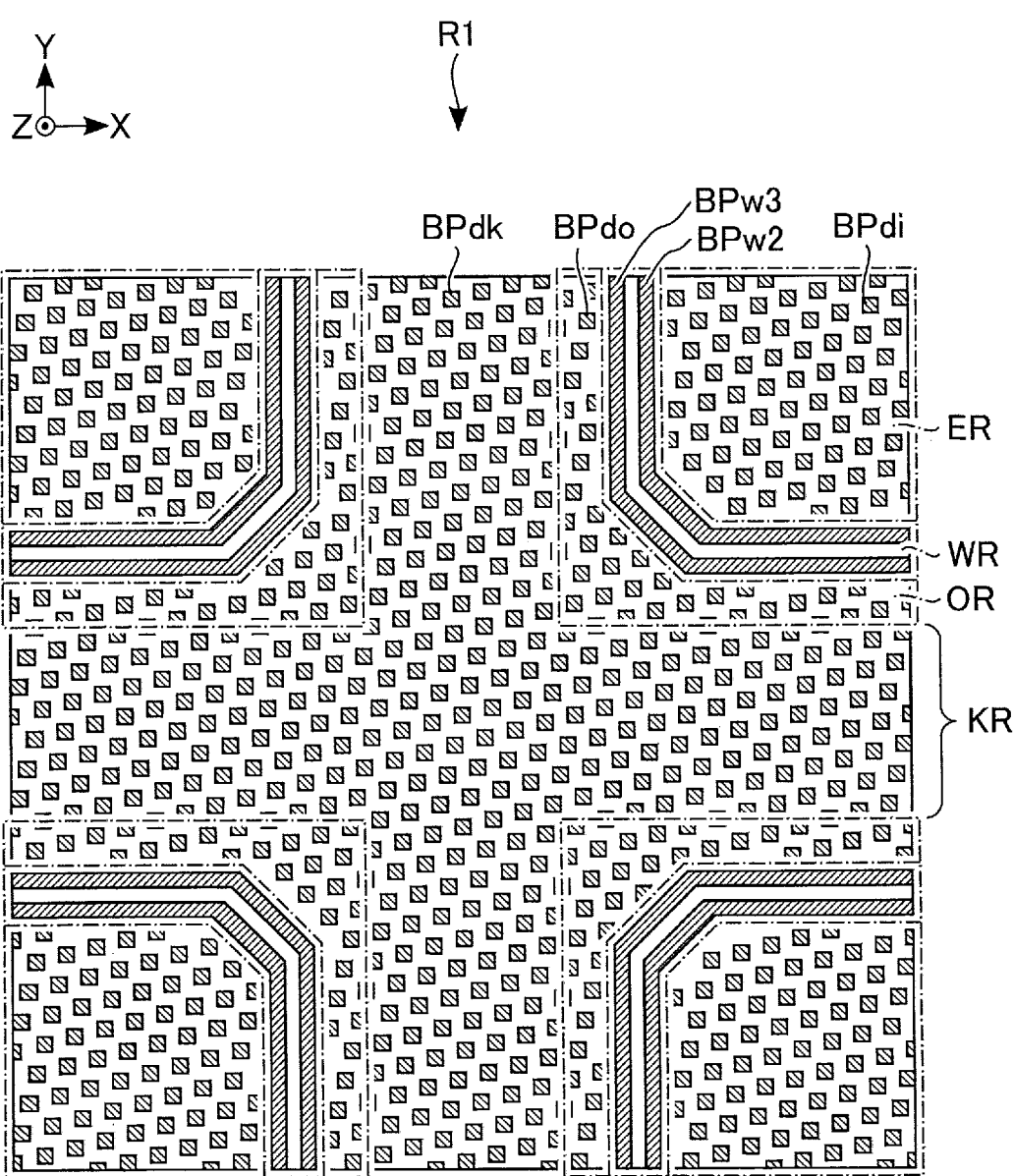
F I G. 7

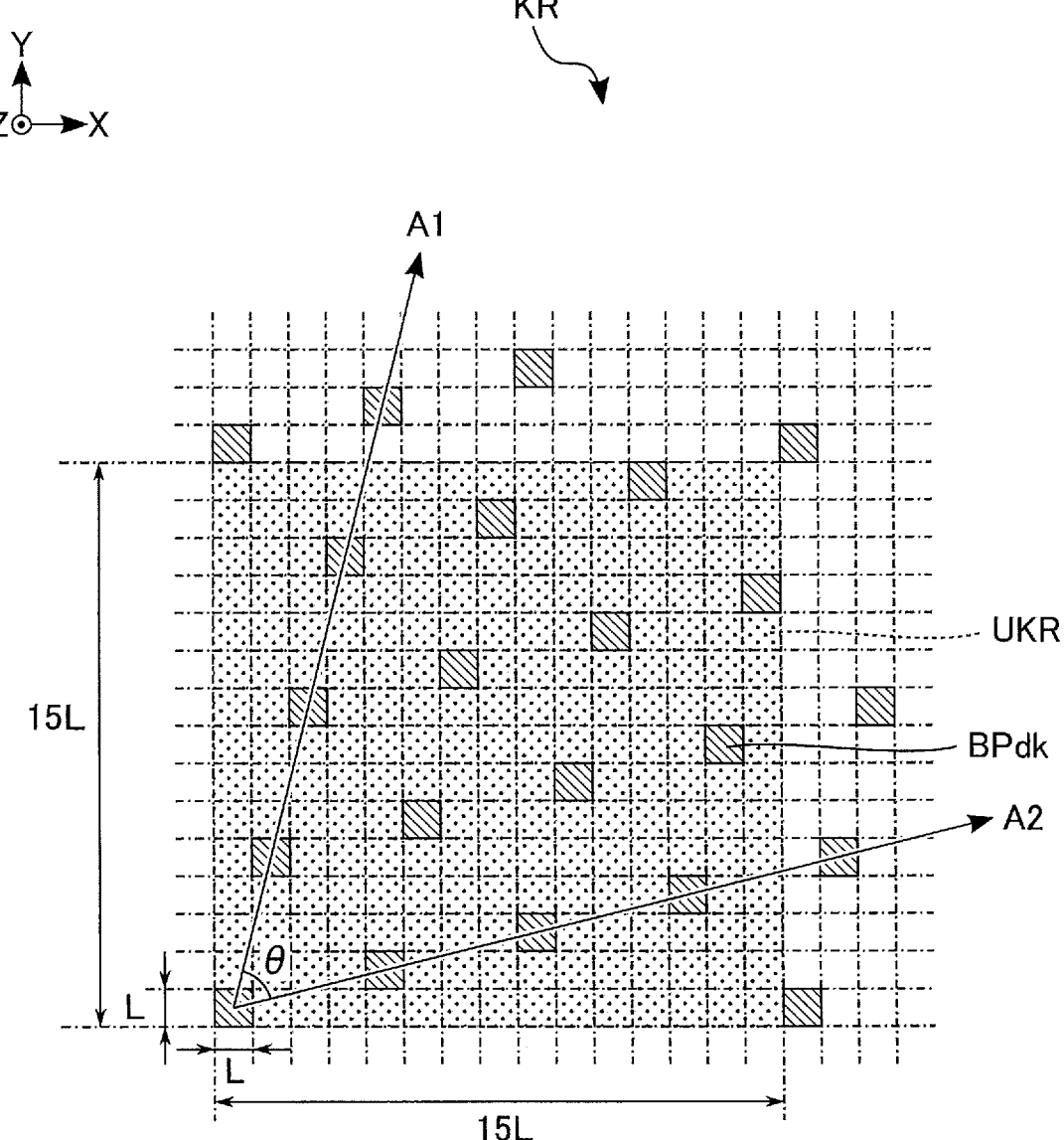
F I G. 8

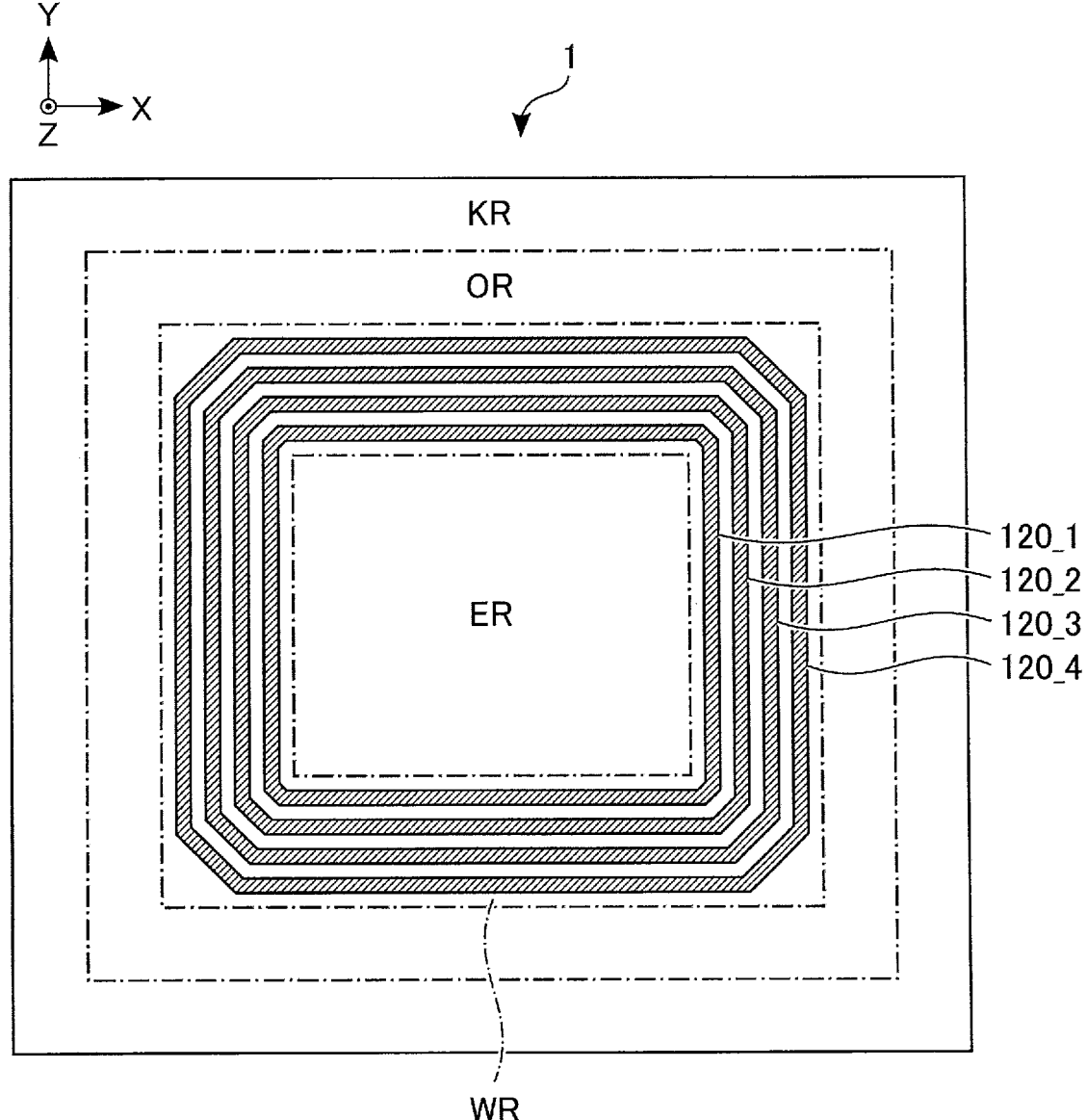
F I G. 10

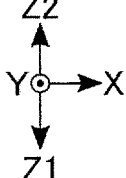
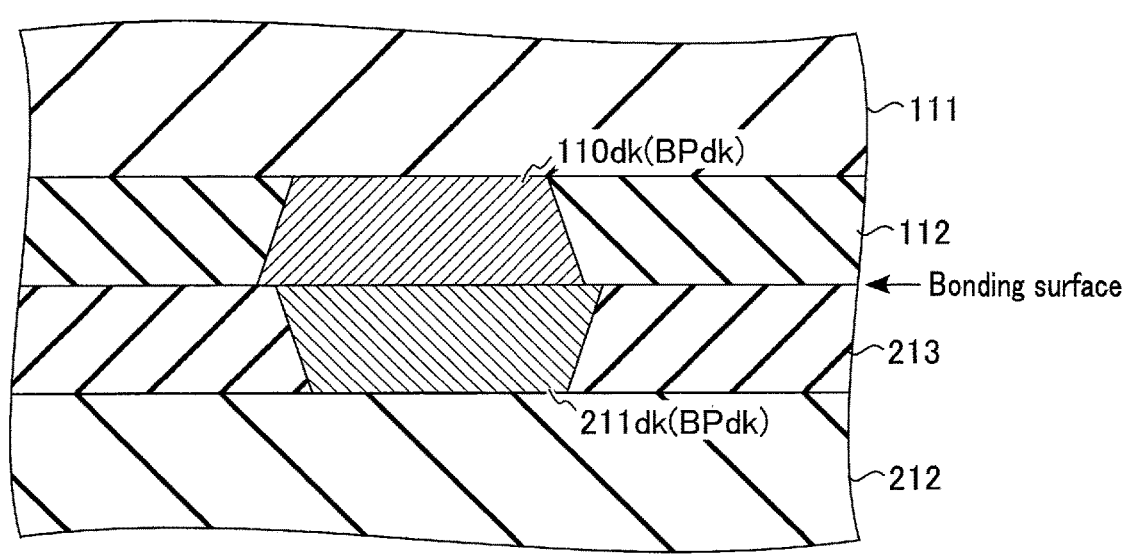
F I G. 11

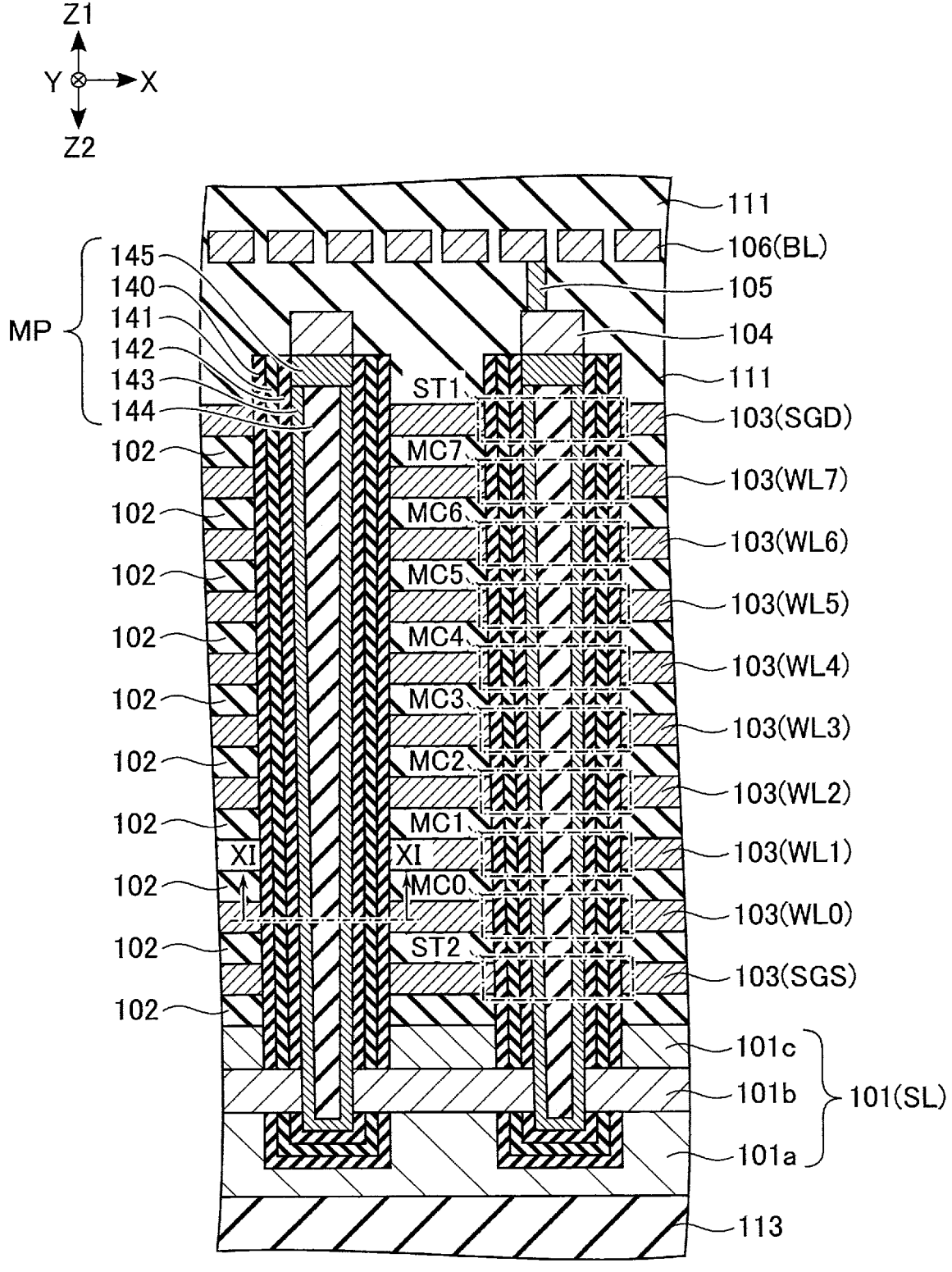
F I G. 12

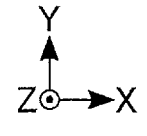
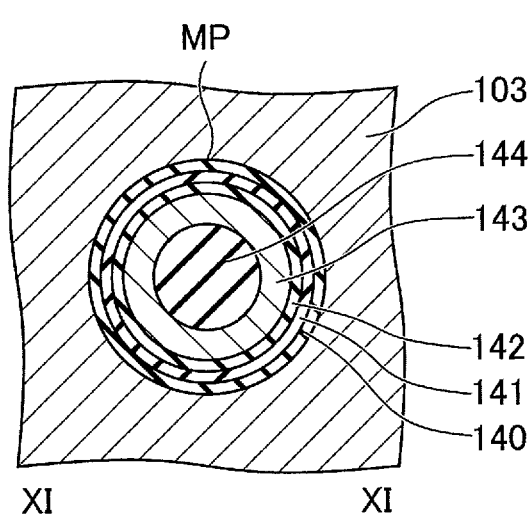
F I G. 13

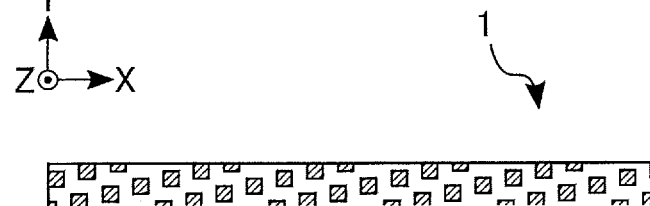
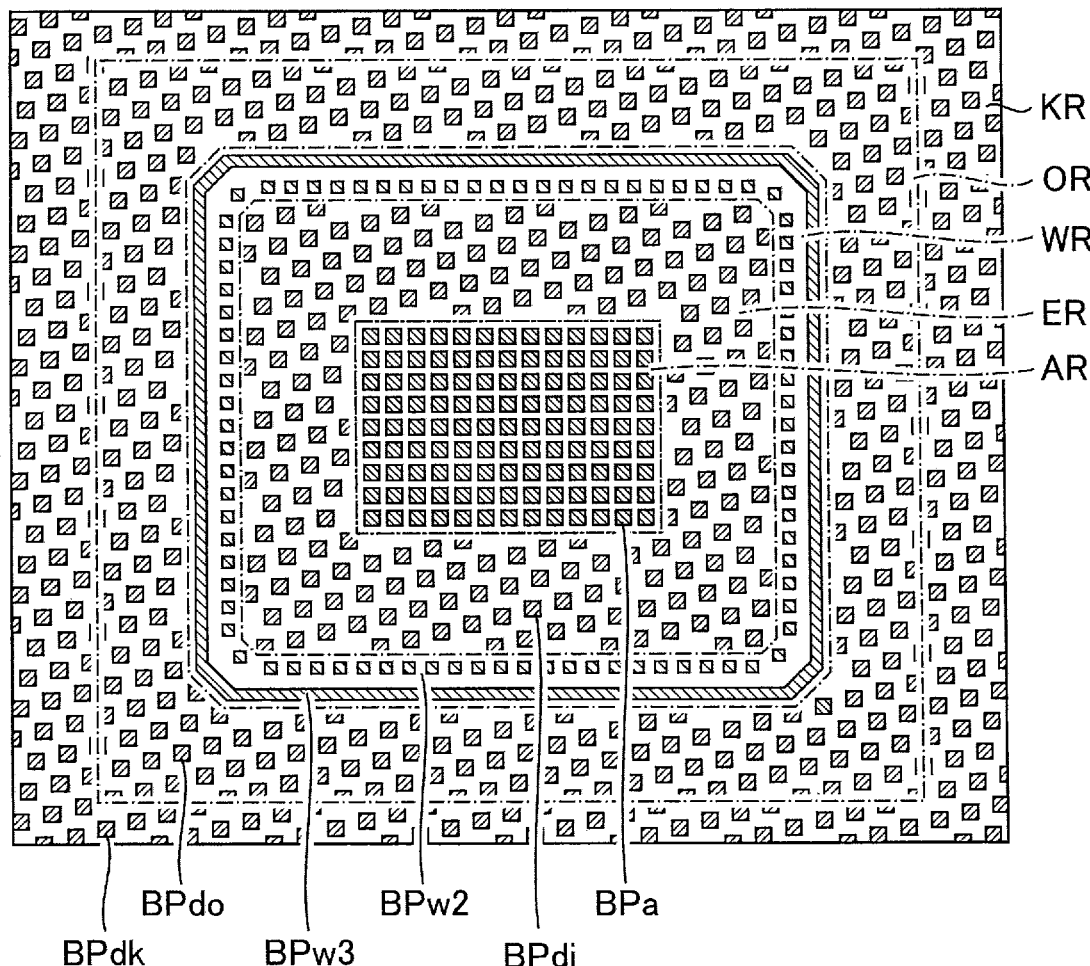
F I G. 14

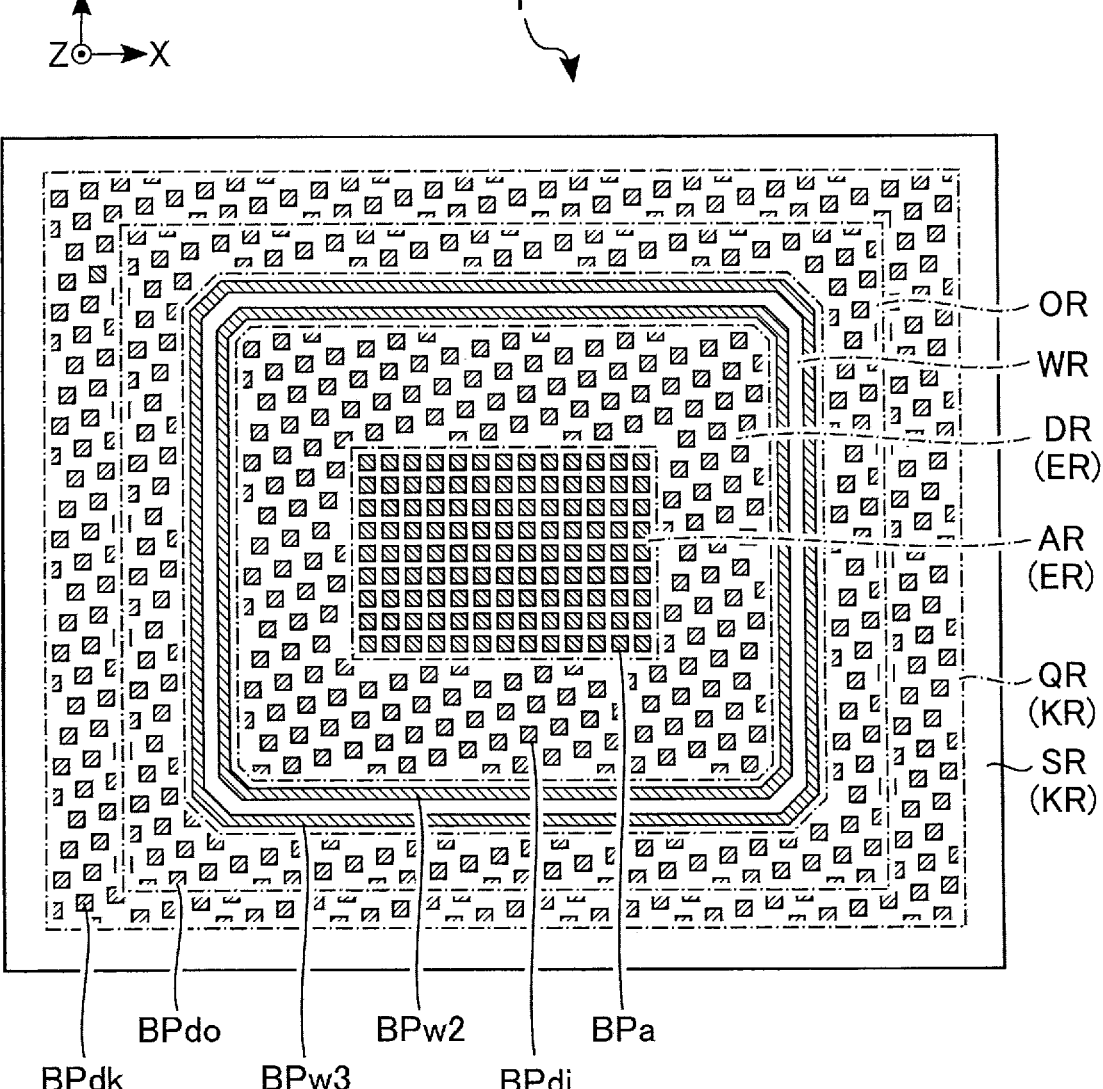
F I G. 16

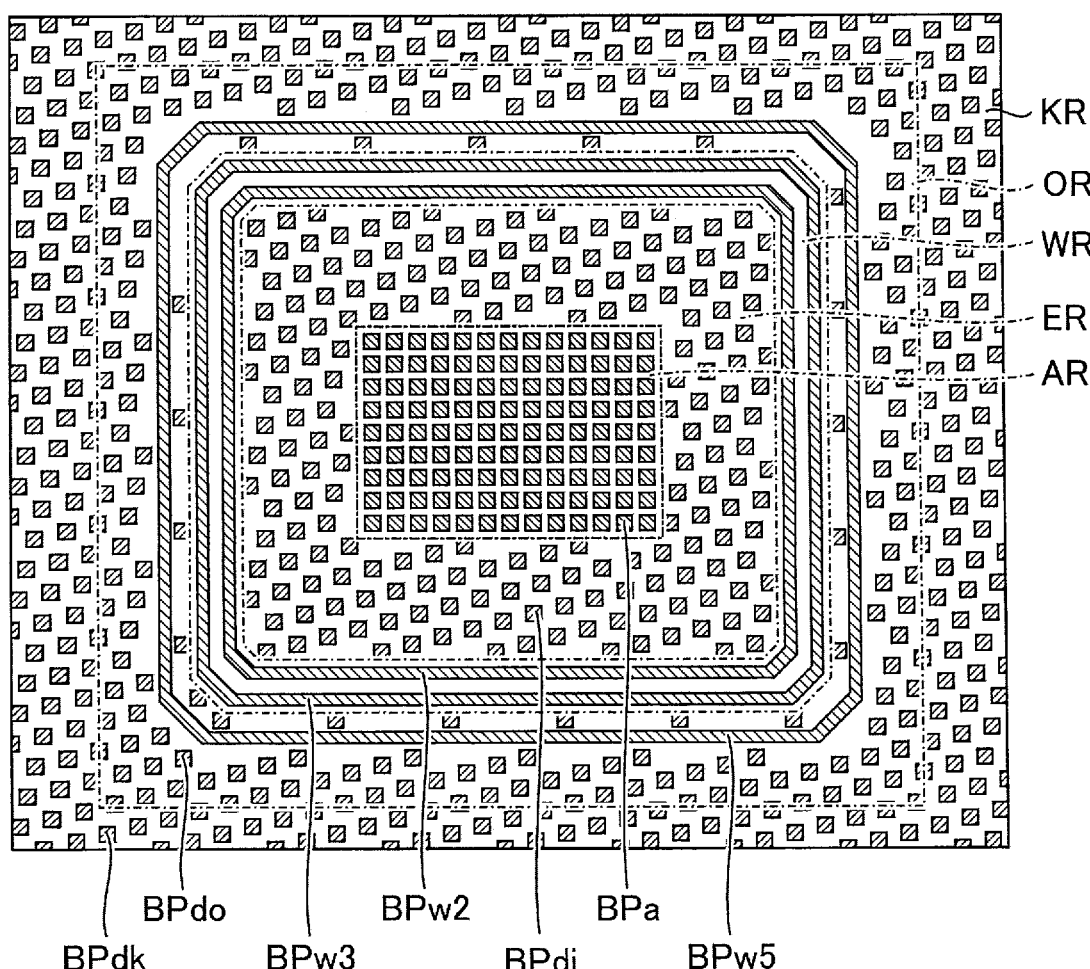
F I G. 17

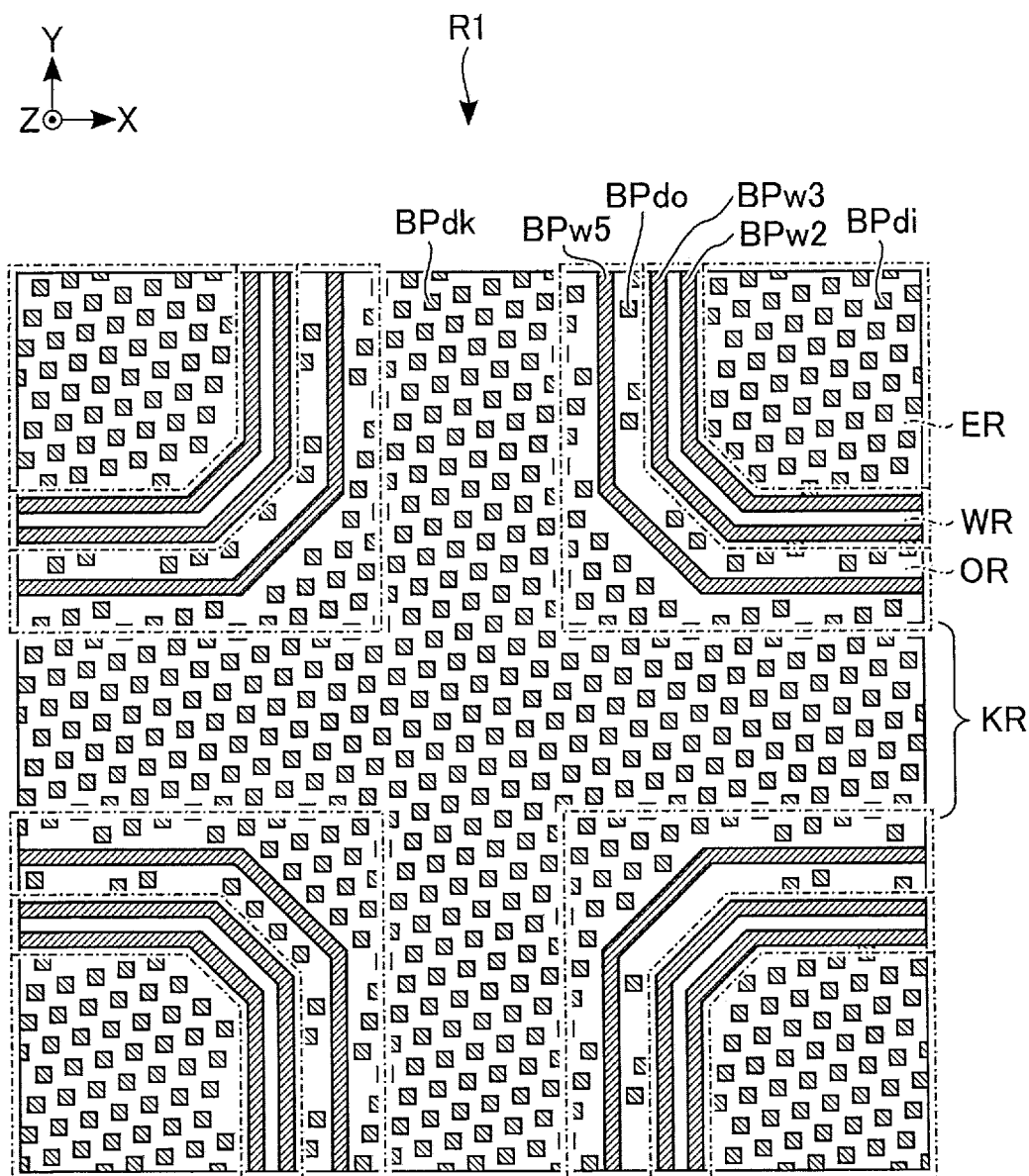
F I G. 18

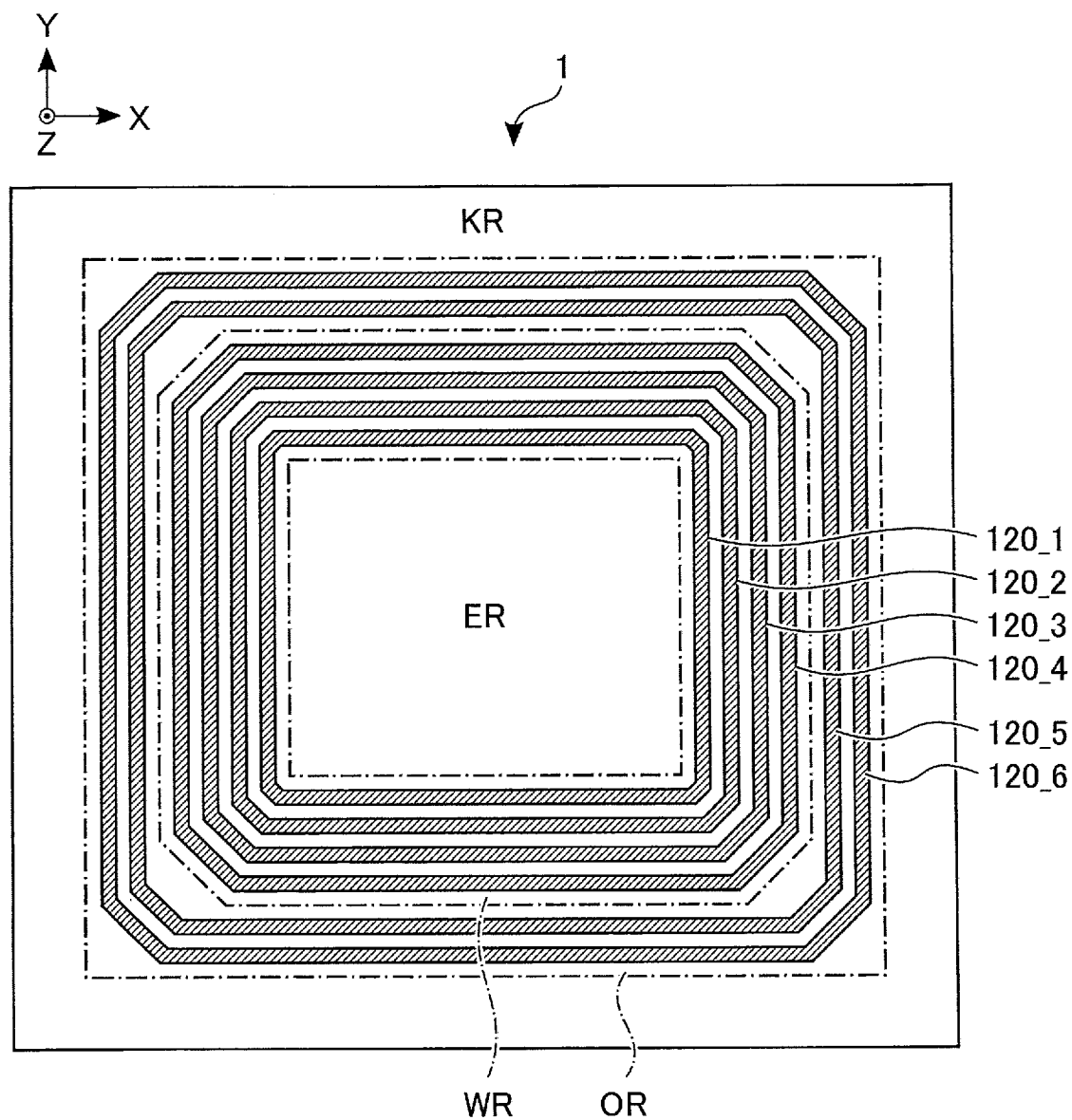
F I G. 20

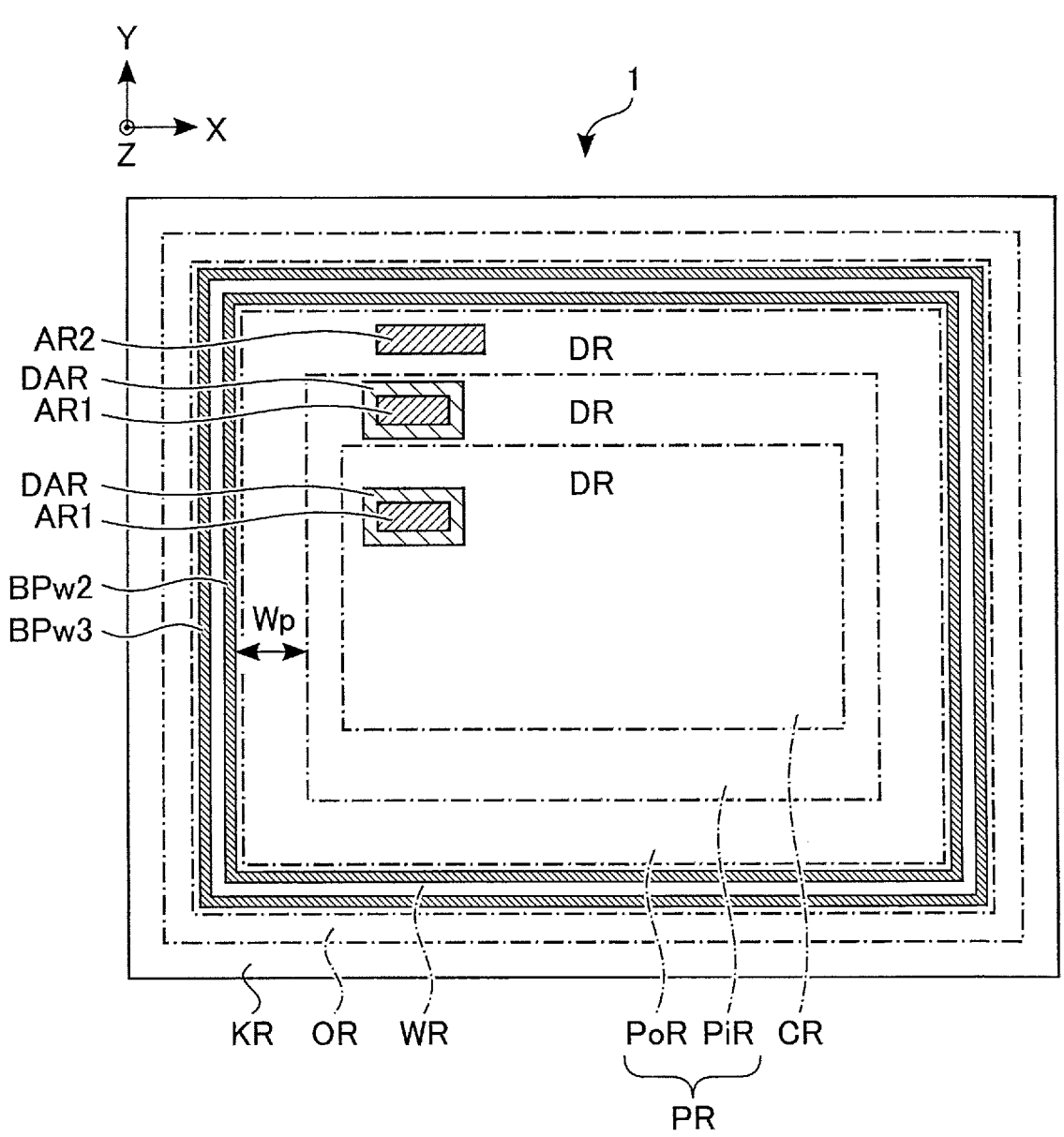
F I G. 21

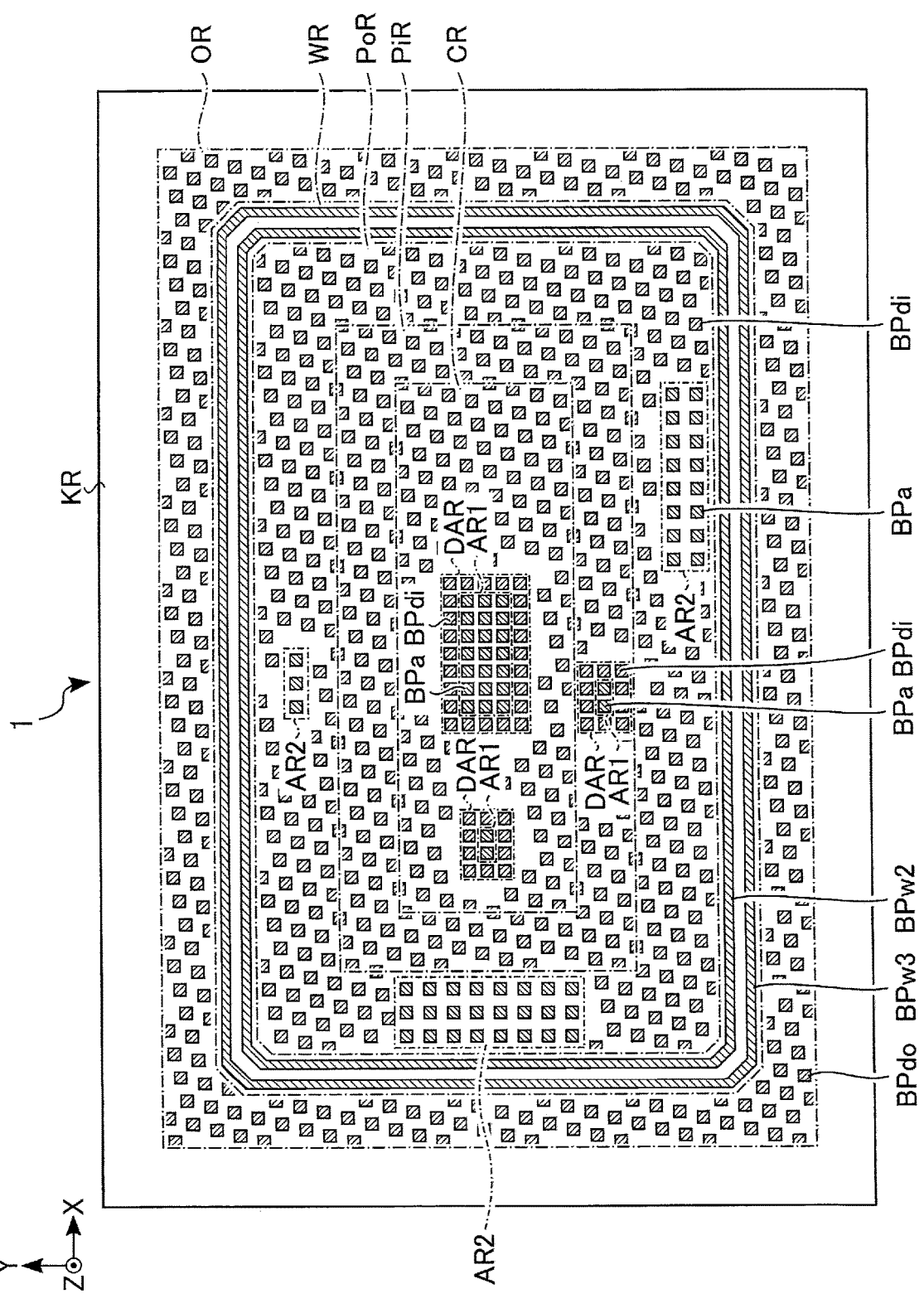
F I G. 22

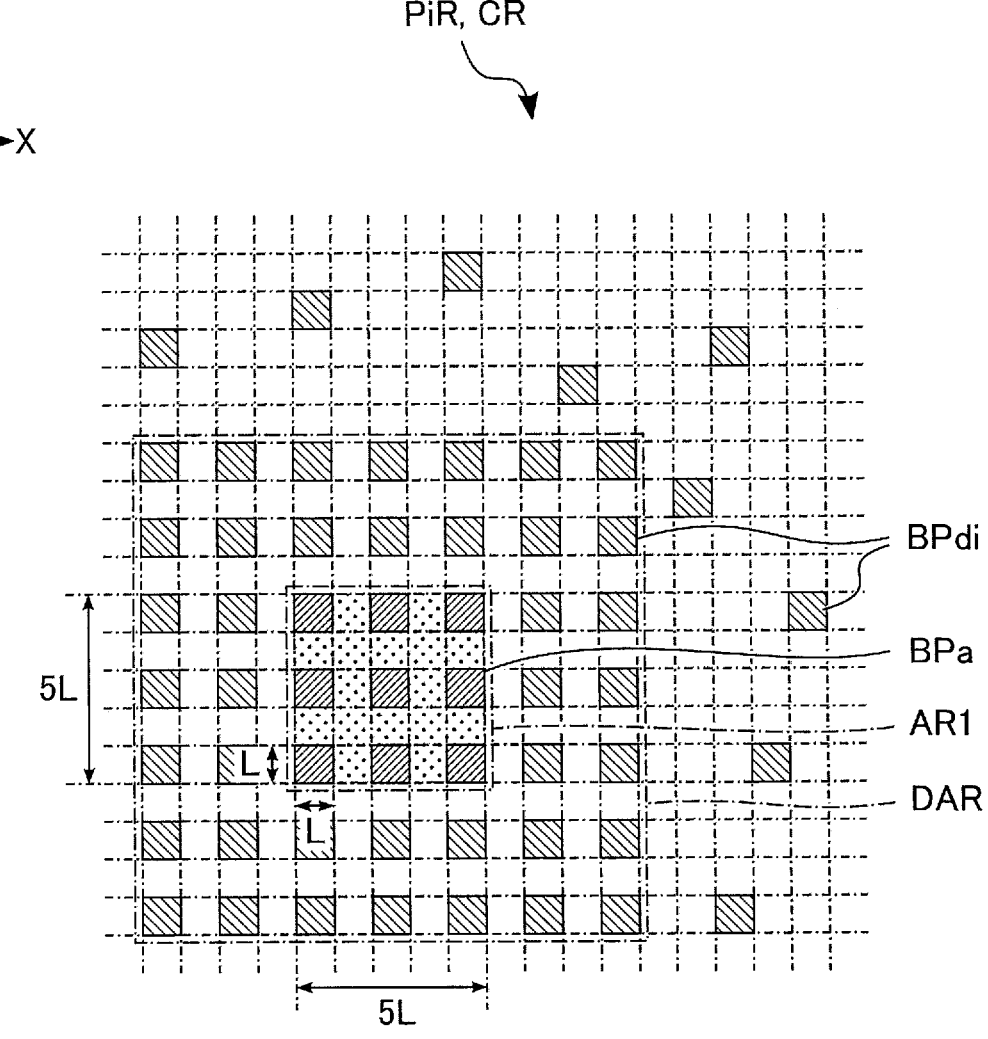
F I G. 23

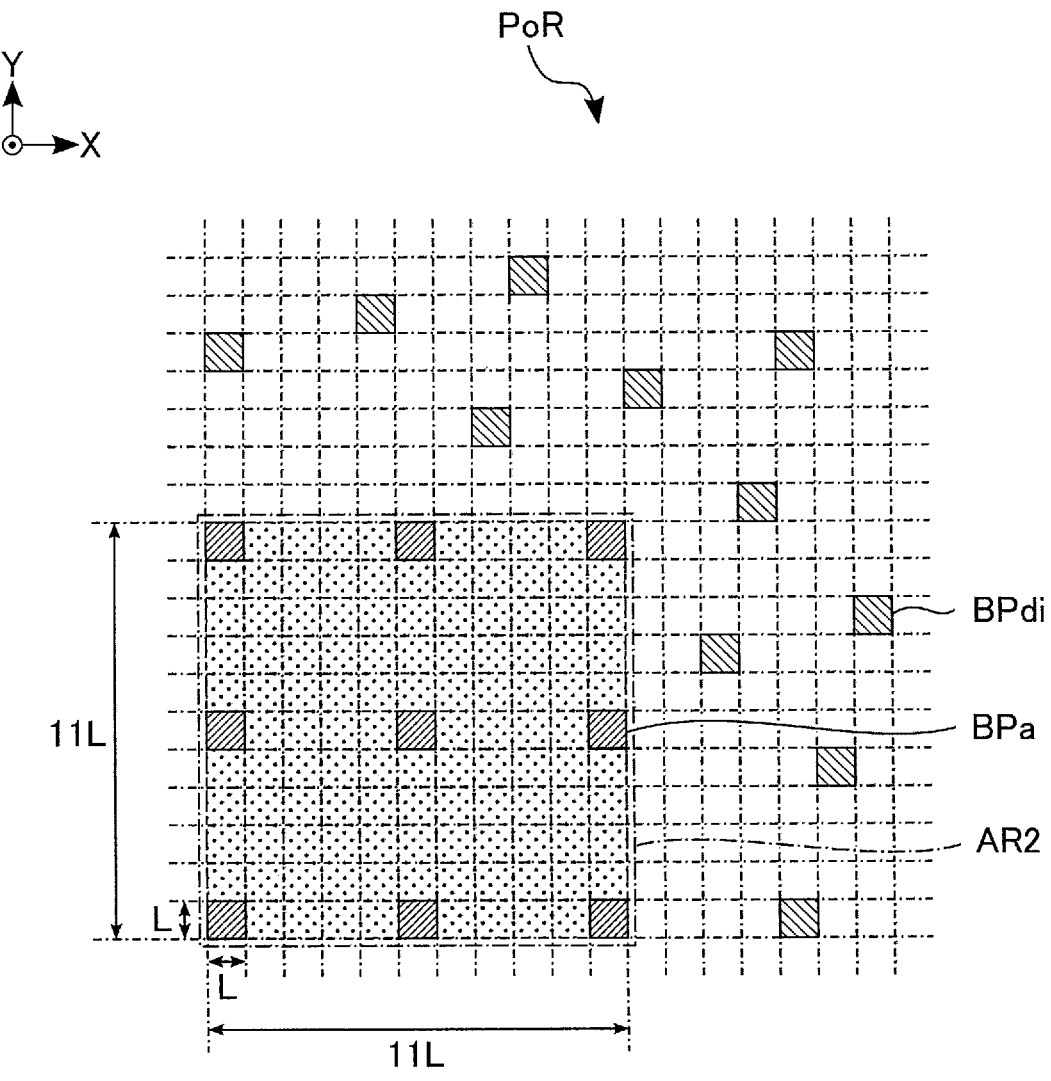
F I G. 24

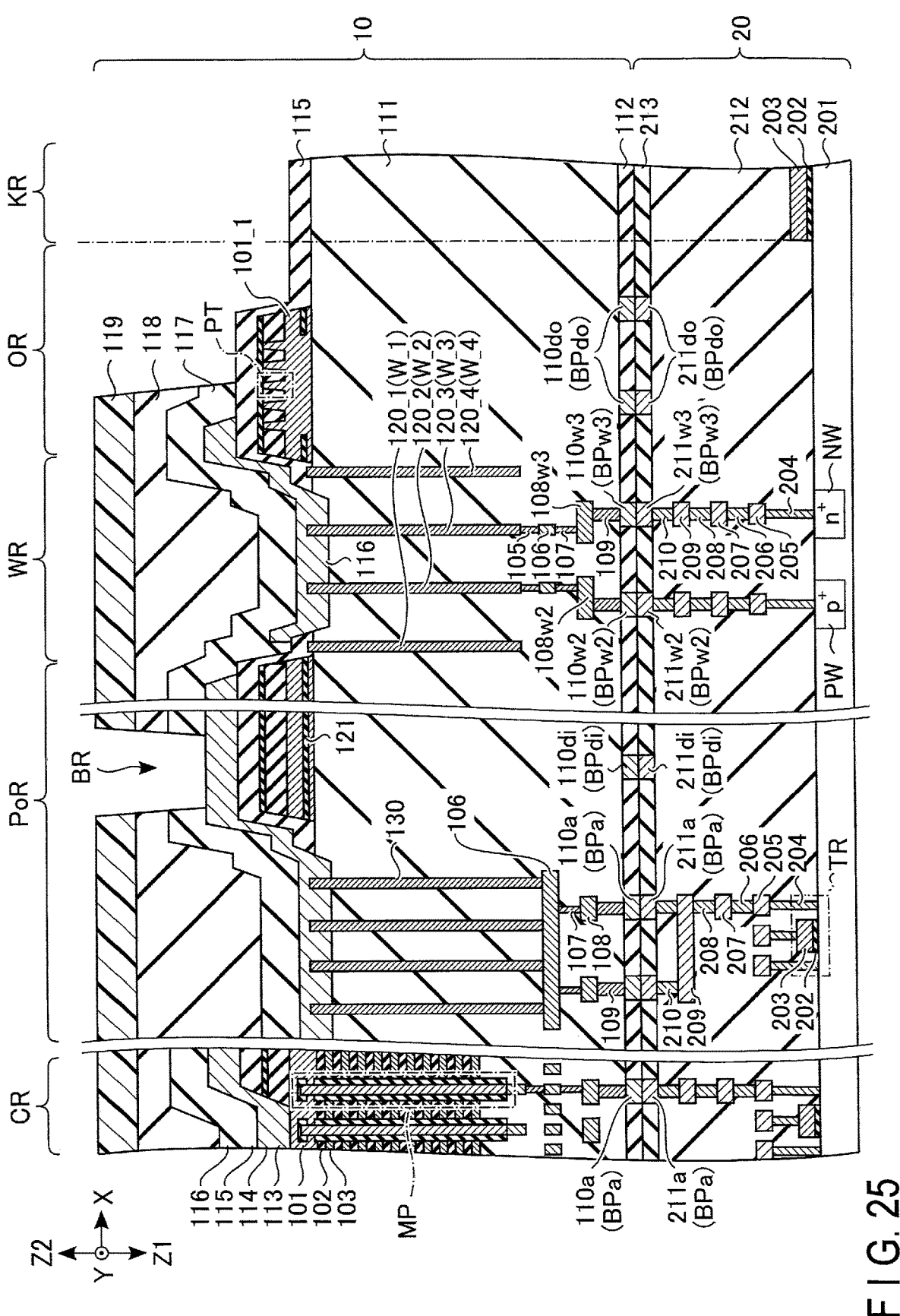
F I G. 25

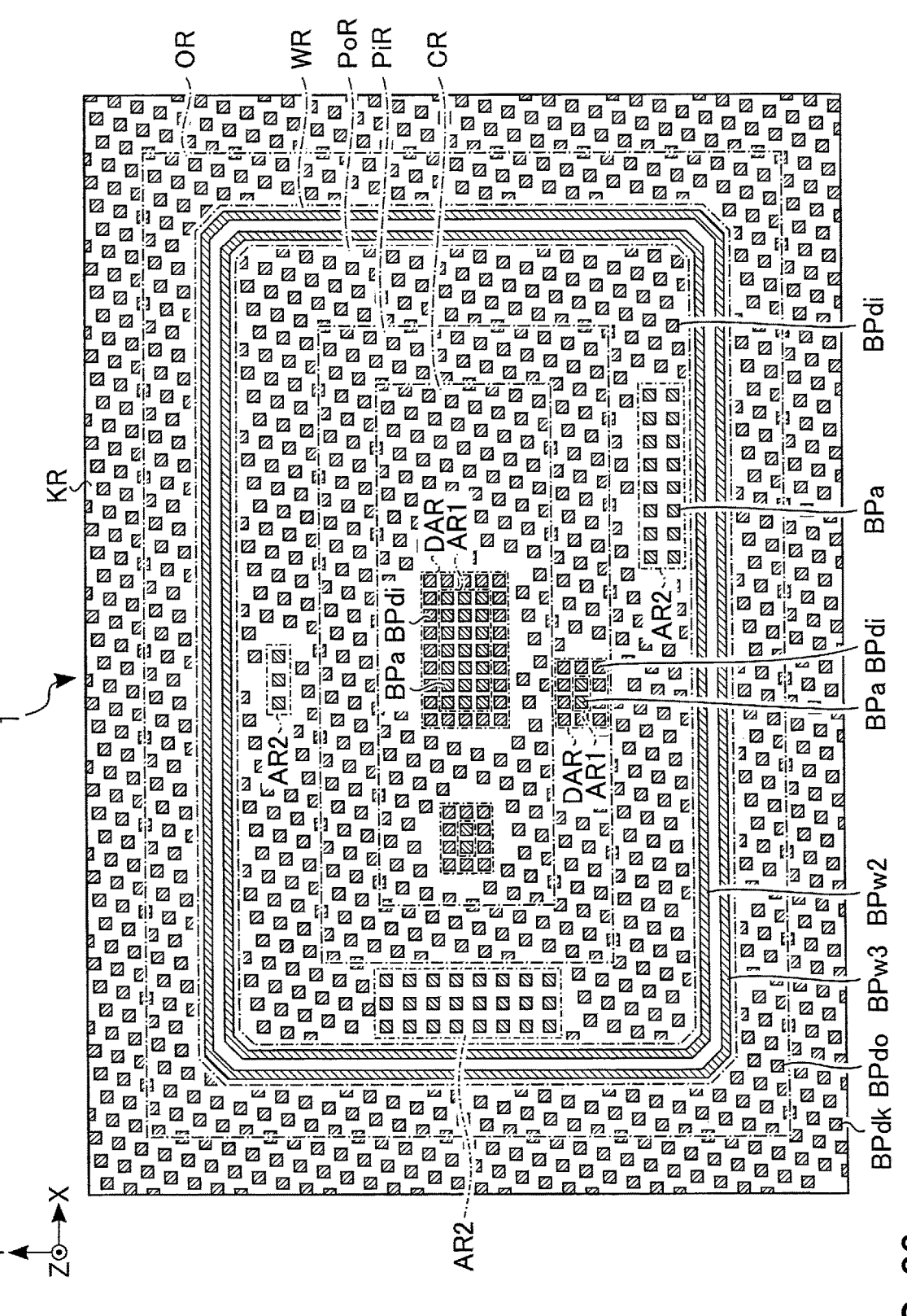
F I G. 26

SEMICONDUCTOR DEVICE

CROSS-REFERENCE TO RELATED APPLICATION(S)

This application is based upon and claims the benefit of priority from Japanese Patent Application No. 2022-099042, filed Jun. 20, 2022, the entire contents of which are incorporated herein by reference.

FIELD

Embodiments described herein relate generally to a semiconductor device.

BACKGROUND

A NAND flash memory is known as a semiconductor device.

BRIEF DESCRIPTION OF THE DRAWINGS

FIG. 1 is a block diagram showing an overall configuration of a semiconductor device according to a first embodiment.

FIG. 2 is a circuit diagram of a memory cell array included in the semiconductor device according to the first embodiment.

FIG. 3 is a perspective view showing an overview of a bonding structure of the semiconductor device according to the first embodiment.

FIG. 5 is a plan view of a bonding surface of the semiconductor device according to the first embodiment.

FIG. 7 is an enlarged view of a bonding surface in an intersection region of kerf regions shown in FIG. 6.

FIG. 8 is a plan view showing an example of a planar layout of bonding pads on a bonding surface in the kerf region in the semiconductor device according to the first embodiment.

FIG. 10 is a plan view showing an example of a planar layout of conductors 120_1 to 120_4 in the semiconductor device according to the first embodiment.

FIG. 11 is a cross-sectional view showing an example of a cross-sectional structure of the bonding pad in the semiconductor device according to the first embodiment.

FIG. 12 is a cross-sectional view showing an example of a cross-sectional structure of a memory cell array in the semiconductor device according to the first embodiment.

FIG. 13 is a cross-sectional view taken along line XI-XI in FIG. 12.

FIG. 14 is a plan view of a bonding surface of the semiconductor device according to a first modification of the first embodiment.

FIG. 16 is a plan view of a bonding surface of the semiconductor device according to the second modification of the first embodiment.

FIG. 17 is a plan view of a bonding surface of the semiconductor device according to a third modification of the first embodiment.

FIG. 18 is an enlarged view of a bonding surface in an intersection region of kerf regions in the semiconductor device according to the third modification of the first embodiment.

FIG. 20 is a plan view showing an example of a planar layout of conductors 120_1 to 120_6 in the semiconductor device according to the third modification of the first embodiment.

FIG. 21 is a plan view of a semiconductor device according to a second embodiment.

FIG. 22 is a plan view of a bonding surface of the semiconductor device according to the second embodiment.

FIG. 23 is a plan view showing an example of a planar layout of bonding pads BPa in an active pad region AR1 and bonding pads BPdi in a dummy pad region DAR in the semiconductor device according to the second embodiment.

FIG. 24 is a plan view showing an example of a planar layout of bonding pads BPa in an active pad region AR2 in the semiconductor device according to the second embodiment.

FIG. 25 is a cross-sectional view showing an example of a cross-sectional structure of the semiconductor device according to the second embodiment.

FIG. 26 is a plan view of a bonding surface of the semiconductor device according a modification of the second embodiment.

DETAILED DESCRIPTION

Figure 4:
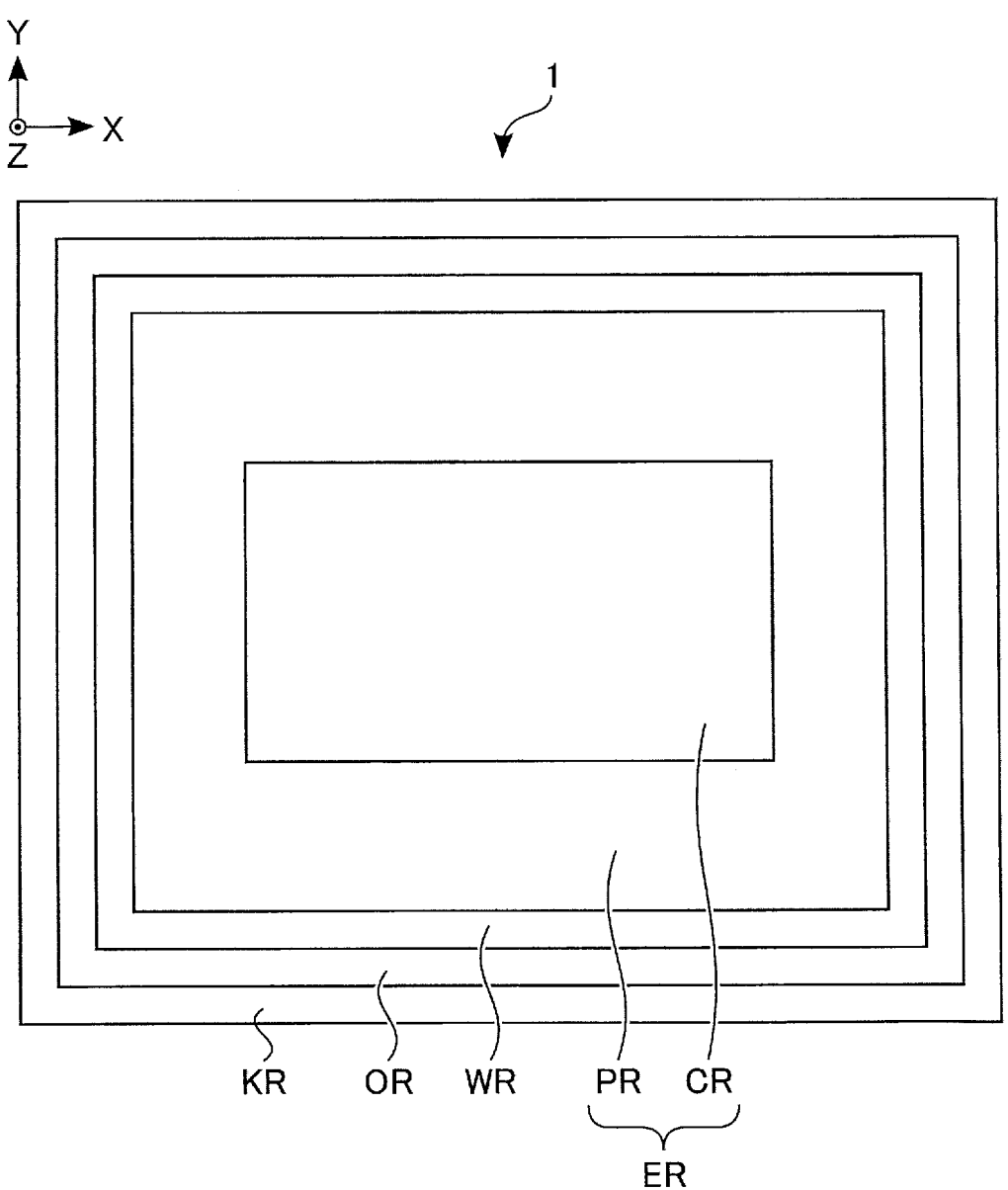
FIG. 4 is a plan view of the semiconductor device according to the first embodiment.

In general, according to one embodiment, a semiconductor device includes a first chip including a substrate, and a second chip bonded to the first chip at a first surface. Each of the first chip and the second chip includes an element region, and an end region including a chip end portion. The first chip includes a plurality of first electrodes that are arranged on the first surface in the end region and are in an electrically uncoupled state. The second chip includes a plurality of second electrodes that are arranged on the first surface in the end region, are in an electrically uncoupled state, and are respectively in contact with the first electrodes.

Hereinafter, embodiments will be described with reference to the accompanying drawings. The description provided hereinafter uses the same reference symbol for components having approximately the same function and configuration. A repeat description may be omitted when unnecessary. The embodiments to be described below are to give examples of devices and methods that realize technical ideas of the embodiments. The technical ideas of the embodiments do not limit the materials, shapes, structures, arrangements, etc. of the structural components to the ones to be described below. Various modifications may be made to the technical ideas of the embodiments without departing from the spirit of the invention. The embodiments and modifications are included in the scope of the claimed inventions and their equivalents.

1. First Embodiment

A semiconductor device according to a first embodiment will be described. As an example of the semiconductor device, a three-dimensionally stacked NAND flash memory, in which memory cell transistors are three-dimensionally stacked on a semiconductor substrate, will be described below.

1. 1 Configuration

1. 1. 1 Overall Configuration of Semiconductor Device

First, an example of an overall configuration of a semiconductor device 1 will be described with reference to FIG. 1. FIG. 1 is a block diagram showing an overall configuration of the semiconductor device 1. In FIG. 1, some of the couplings between the structural elements are indicated by arrows; however, the couplings between the structural elements are not limited thereto.

The semiconductor device 1 is, for example, a three-dimensionally stacked NAND flash memory. The three-dimensionally stacked NAND flash memory includes a plurality of non-volatile memory cell transistors arranged three-dimensionally on a semiconductor substrate.

As shown in FIG. 1, the semiconductor device 1 includes an array chip 10 and a circuit chip 20. The semiconductor device 1 has a structure in which the array chip 10 and the circuit chip 20 are bonded (hereinafter referred to as a "bonding structure").

The array chip 10 is a chip in which an array of non-volatile memory cell transistors is provided. The circuit chip 20 is a chip in which circuits that control the array chip 10 are provided. The semiconductor device 1 of the present embodiment is formed by bonding the array chip 10 and the circuit chip 20. Hereinafter, the array chip 10 and the circuit chip 20 will each be simply referred to as a "chip" unless otherwise specified. A plurality of array chips 10 may be provided. In this case, the array chips 10 may be bonded to stack on the circuit chip 20.

The array chip 10 includes one or more memory cell arrays 11. The memory cell array 11 is a region in which the non-volatile memory cell transistors are arranged three-dimensionally. In the example of FIG. 1, the array chip 10 includes one memory cell array 11.

The circuit chip 20 includes a sequencer 21, a voltage generator 22, a row decoder 23, and a sense amplifier 24.

The sequencer 21 is a control circuit of the semiconductor device 1. For example, the sequencer 21 is coupled to the voltage generator 22, the row decoder 23, and the sense amplifier 24. Then, the sequencer 21 controls the voltage generator 22, the row decoder 23, and the sense amplifier 24. In addition, the sequencer 21 controls the operation of the entire semiconductor device 1 based on control of an external controller. More specifically, the sequencer 21 executes a write operation, a read operation, an erase operation, etc.

The voltage generator 22 is a circuit that generates voltages to be used for the write operation, read operation, erase operation, etc. For example, the voltage generator 22 is coupled to the row decoder 23 and the sense amplifier 24. The voltage generator 22 supplies the generated voltages to the row decoder 23, the sense amplifier 24, etc.

The row decoder 23 is a circuit that decodes a row address. The row address is an address signal for designating interconnects in a row direction in the memory cell array 11. The row decoder 23 supplies the memory cell array 11 with the voltages applied from the voltage generator 22 based on a result of decoding the row address.

The sense amplifier 24 is a circuit that writes and reads data. In a read operation, the sense amplifier 24 senses data read from the memory cell array 11. In a write operation, the sense amplifier 24 supplies the memory cell array 11 with voltages corresponding to write data.

Next, an internal configuration of the memory cell array 11 will be described. The memory cell array 11 includes a plurality of blocks BLK. The block BLK is, for example, a set of a plurality of memory cell transistors whose data is erased in a batch. The plurality of memory cell transistors in the block BLK are respectively associated with rows and columns. In the example of FIG. 1, the memory cell array 11 includes blocks BLK0, BLK1, and BLK2.

Each block BLK includes a plurality of string units SU. Each string unit SU is, for example, a set of a plurality of NAND strings which are selected in a batch in a write operation or read operation. Each NAND string includes a set of a plurality of memory cell transistors coupled in series. In the example of FIG. 1, each block BLK includes four string units SU0 to SU3. The number of blocks BLK in the memory cell array 11 and the number of string units SU in each of the blocks BLK are discretionary.

1. 1. 2 Circuit Configuration of Memory Cell Array

Next, an example of a circuit configuration of the memory cell array 11 will be described with reference to FIG. 2. FIG. 2 is a circuit diagram of the memory cell array 11. The example of FIG. 2 shows a circuit configuration of a single block BLK.

As shown in FIG. 2, each string unit SU includes a plurality of NAND strings NS.

Each of the NAND strings NS includes a plurality of memory cell transistors MC and select transistors ST1 and ST2. In the example of FIG. 2, each NAND string NS includes eight memory cell transistors MC0 to MC7. The number of memory cell transistors MC included in the NAND string NS is discretionary.

Each of the memory cell transistors MC is a memory element that non-volatilely stores data. Each of the memory cell transistors MC includes a control gate and a charge storage film. Each of the memory cell transistors MC may be of a metal-oxide-nitride-oxide-silicon (MONOS) type or may be of a floating gate (FG) type. The MONOS type uses an insulating layer as a charge storage film. The FG type uses a conductor as a charge storage film. Hereinafter, the case in which the memory cell transistors MC are of the MONOS type will be described.

The select transistors ST1 and ST2 are switching elements. The select transistors ST1 and ST2 are each used for the selection of a string unit SU in various operations. The number of select transistors ST1 and ST2 included in the NAND string NS is discretionary. It suffices that each NAND string NS includes one or more select transistors ST1 and one or more select transistors ST2.

In each NAND string NS, current paths of the select transistor ST2, the memory cell transistors MC0 to MC7, and the select transistor ST1 are coupled in series. The drain of the select transistor ST1 is coupled to a corresponding bit line BL. The source of the select transistor ST2 is coupled to the source line SL.

The memory cell transistors MC0 to MC7 included in the same block BLK have their control gates coupled in common to word lines WL0 to WL7, respectively. More specifically, for example, the block BLK includes four string units SU0 to SU3. Then, each string unit SU includes a plurality of memory cell transistors MC0. The plurality of memory cell transistors MC0 in the same block BLK have their control gates coupled in common to the single word line WL0. The same applies to the memory cell transistors MC1 to MC7.

A plurality of select transistors ST1 in a string unit SU have their gates coupled in common to a single select gate line SGD. More specifically, the gates of the plurality of select transistors ST1 in the string unit SU0 are coupled in common to a select gate line SGD0. The gates of the plurality of select transistors ST1 in the string unit SU1 are coupled in common to a select gate line SGD1. The gates of the plurality of select transistors ST1 in the string unit SU2 are coupled in common to a select gate line SGD2. The gates of the plurality of select transistors ST1 in the string unit SU3 are coupled in common to a select gate line SGD3.

A plurality of select transistors ST2 in the same block BLK have their gates coupled in common to a select gate line SGS. A different select gate line SGS may be provided for each string unit SU, similarly to the select gate lines SGD.

The word lines WL0 to WL7, the select gate lines SGD0 to SGD3, and the select gate line SGS are each coupled to the row decoder 23.

Each bit line BL is coupled in common to one NAND string NS included in each string unit SU in each block BLK. The same column address is assigned to a plurality of NAND strings NS coupled to one bit line BL. Each bit line BL is coupled to the sense amplifier 24.

The source line SL is shared by, for example, a plurality of blocks BLK.

A set of a plurality of memory cell transistors MC coupled to a common word line WL in one string unit SU is referred to as, for example, a "cell unit CU". For example, write and read operations are executed on a cell unit CU basis.

1. 1. 3 Bonding Structure of Semiconductor Device

Next, an overview of a bonding structure of the semiconductor device 1 will be described with reference to FIG. 3. FIG. 3 is a perspective view showing an overview of the bonding structure of the semiconductor device 1.

As shown in FIG. 3, the array chip 10 and the circuit chip 20 each include a plurality of bonding pads BP arranged on the respective surfaces facing each other. In the bonding structure, one bonding pad BP of the array chip 10 and one bonding pad BP of the circuit chip 20 are bonded together, and form one bonding pad BP. In other words, an electrode (a conductor) forming the bonding pad BP on the array chip 10 and an electrode (a conductor) forming the bonding pad BP on the circuit chip 20 are bonded together, whereby the bonding pad BP is formed.

In the following description, a plane formed by the array chip 10 and the circuit chip 20 bonded together (hereinafter referred to as a "bonding surface") is defined as an XY plane. On the XY plane, the directions perpendicular to each other are defined as an X direction and a Y direction. A direction approximately perpendicular to the XY plane and headed from the array chip 10 toward the circuit chip 20 is defined as a Z1 direction. A direction approximately perpendicular to the XY plane and headed from the circuit chip 20 toward the array chip 10 is defined as a Z2 direction. The Z1 and Z2 directions will be referred to as the Z direction, unless otherwise specified.

1. 1. 4 Planar Layout of Semiconductor Device

Next, an example of a planar layout of the semiconductor device 1 will be described with reference to FIG. 4. FIG. 4 is a plan view of the semiconductor device 1.

As shown in FIG. 4, the planar layout of the semiconductor device 1 roughly includes an element region ER, a wall region WR, an outer peripheral region OR, and a kerf region KR. Furthermore, the element region ER includes a core region CR and a peripheral circuit region PR.

The element region ER is a region in which elements that constitute the semiconductor device 1, such as the memory cell array 11, the sequencer 21, the voltage generator 22, the row decoder 23, and the sense amplifier 24, are provided.

The core region CR is, for example, a rectangular region provided in a central part of the element region ER. The memory cell array 11 is arranged in the core region CR of the array chip 10. The row decoder 23 and the sense amplifier 24 may be arranged in the core region CR of the circuit chip 20. The core region CR may be in any shape and arranged in any region. If the semiconductor device 1 has a plurality of memory cell arrays 11, the element region ER may include a plurality of core regions CR.

The peripheral circuit region PR is a square ring-shaped region, for example, that surrounds the outer periphery of the core region CR in the element region ER. For example, the sequencer 21 and the voltage generator 22 are arranged in the peripheral circuit region PR. Alternatively, a plurality of external connection terminals used for coupling the semiconductor device 1 to an external device are arranged in the peripheral circuit region PR. The semiconductor device 1 performs transmission and reception of signals with the external device via the external connection terminals. Furthermore, the semiconductor device 1 is provided with a power supply from outside via the external connection terminals.

The wall region WR is, for example, a square ring-shaped region provided so as to surround the outer periphery of the element region ER. The wall region WR is provided with members to stabilize the electric potential of a power supply line, a well, etc. by fixing the outer periphery of the semiconductor device 1 at the same electric potential (ground potential VSS). For example, the members provided in the wall region WR have a function of releasing static electricity to the substrate. Thus, destruction of the elements that may be caused by static electricity is suppressed.

The outer peripheral region OR is, for example, a square ring-shaped region provided so as to surround the wall region WR. A plurality of semiconductor devices 1 are formed on a wafer and cut into chips in a dicing process. For example, in the dicing process, a crack or a peeling of an interlayer insulating film, etc., may occur at an end portion of the semiconductor device 1. The outer peripheral region OR is provided to prevent the crack or the peeling from reaching the inside of the semiconductor device 1.

The kerf region KR is, for example, a square ring-shaped region provided to surround the outer periphery of the outer peripheral region OR. The kerf region KR is an end region including a chip end portion. The kerf region KR is a region provided between semiconductor devices 1 formed on the wafer. The kerf region KR is cut in the dicing process, whereby the semiconductor devices 1 formed on the wafer are cut into chips. For example, the kerf region KR is provided with, for example, alignment marks and characteristics check patterns used when manufacturing the semiconductor devices 1. The kerf region KR of the embodiment includes bonding pads BP. Structures in the kerf region KR may be removed by the dicing process.

1. 1. 5 Planar Layout of Bonding Surface

An example of the planar layout of the bonding surface will be described with reference to FIG. 5. FIG. 5 is a plan view of the bonding surface. In the drawings to be referred to below, in the plan views, hatching is added as appropriate to facilitate visualization of the drawings. The hatching applied in the plan views does not necessarily relate to the material or characteristics of the hatched components.

As shown in FIG. 5, the bonding surface of the element region ER includes an active pad region AR and a dummy pad region DR. In the example shown in FIG. 5, the active pad region AR is a rectangular region provided near the center of the element region ER. The number of active pad regions AR provided in the element region ER is discretionary. The active pad region AR may be arranged in both or either of the core region CR and the peripheral circuit region PR of the element region ER.

The active pad region AR is a region in which bonding pads BPa (electrodes that form bonding pads BPa) are arranged. The bonding pad BPa functions as a path of a signal or power supply when the semiconductor device 1 is operated. In other words, the bonding pad BPa is an active pad electrically coupled to a path of a signal or power supply. In the example shown in FIG. 5, a plurality of bonding pads BPa are arranged in a square grid pattern inside the active pad region AR. The number and placement of the bonding pads BPa arranged in one active pad region AR are discretionary.

The dummy pad region DR is a region in which a plurality of bonding pads BPdi are arranged. The dummy pad region DR corresponds to the region other than the active pad region AR in the bonding surface of the element region ER. The bonding pads BPdi do not function as a path of a signal or power supply when the semiconductor device 1 is operated. In other words, the bonding pads BPdi are dummy pads that are not electrically coupled to a path of either a signal or power supply. The dummy pads are in an electrically uncoupled state (a floating state). For example, the bonding pads BPdi are arranged in a pattern different from a square grid pattern.

On the bonding surface in the wall region WR, bonding pads BPw2 and BPw3 are arranged. For example, the bonding pads BPw2 and BPw3 function as a part of a discharge path to release static electricity from the array chip 10 side to the circuit chip 20 side. The bonding pads BPw2 and BPw3 are electrically coupled to the discharge path. For example, each of the bonding pads BPw2 and BPw3 has an approximately square ring shape. For example, the bonding pad BPw2 is arranged to surround the element region ER. The bonding pad BPw3 is arranged to surround the bonding pad BPw2 at a distance from the bonding pad BPw2. The bonding pads BPw2 and BPw3 do not necessarily have a continuous ring shape.

A plurality of bonding pads BPdo are arranged on the bonding surface in the outer peripheral region OR. The bonding pads BPdo do not function as a path of either a signal or power supply when the semiconductor device 1 is operated. In other words, the bonding pads BPdo are dummy pads similar to the bonding pads BPdi. For example, the bonding pads BPdo are arranged in a pattern different from a square grid pattern.

A plurality of bonding pads BPdk are arranged on the bonding surface of the kerf region KR. The bonding pads BPdk do not function as a path of either a signal or power supply when the semiconductor device 1 is operated. In other words, the bonding pads BPdk are dummy pads similar to the bonding pads BPdi and BPdo. For example, the bonding pads BPdk are arranged in a pattern different from a square grid pattern. Details of the arrangement of the bonding pads BPdk will be described later.

The pad sizes and the arrangement patterns of the bonding pads BPdi, BPdo, and BPdk may be the same or different. The bonding pads BPdi, BPdo, and BPdk will be referred to as the "bonding pads" BPd, unless otherwise specified.

1. 1. 6 Planar Layout of Bonding Surface in Kerf Region

Figure 6:
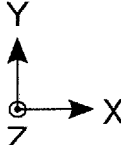
FIG. 6 is a plan view of a semiconductor wafer in which a plurality of semiconductor devices according to the first embodiment are arranged.
Figure 6:
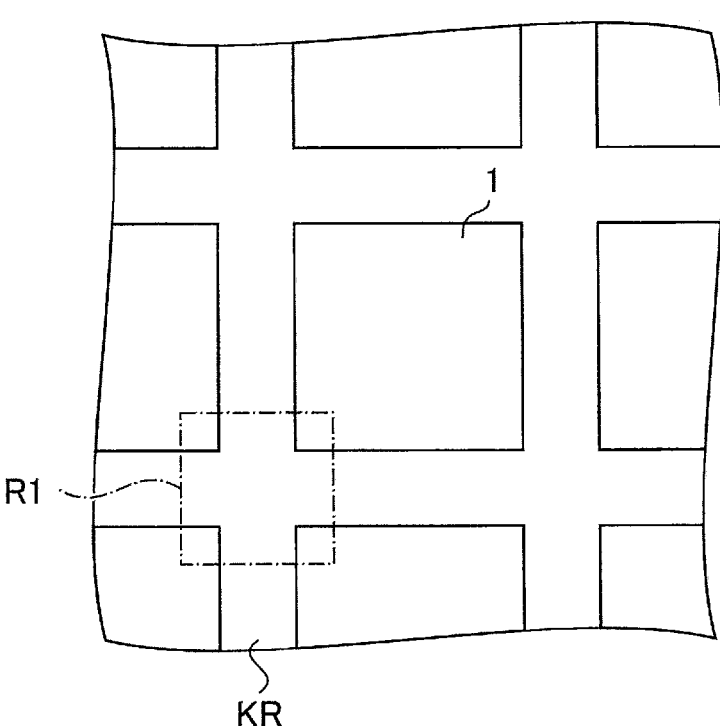

Details of the planar layout of the bonding surface in the kerf region KR will be described with reference to FIGS. 6 and 7. FIG. 6 is a plan view of the wafer on which a plurality of semiconductor devices 1 are arranged. FIG. 7 is an enlarged view of a bonding surface in an intersection region R1 of the kerf regions KR shown in FIG. 6.

As shown in FIG. 6, the semiconductor devices 1 are arranged with the kerf region KR interposed therebetween on the wafer before the dicing process.

As shown in FIG. 7, the bonding pads BPdk are arranged on the whole area of the bonding surface in the kerf regions KR excluding alignment patterns, characteristics check patterns, etc. In the example shown in FIG. 7, the bonding pads BPd are arranged also on the boundary between the outer peripheral region OR and the kerf region KR of each semiconductor device 1. However, bonding pads BPd are not necessarily arranged on the boundary

1. 1. 7 Arrangement Pattern and Coverage of Bonding Pads BPdk

An arrangement pattern and a coverage of the bonding pads BPdk will be described with reference to FIG. 8. The coverage is a ratio of an area occupied by the bonding pads BP in a region of the bonding surface to an area of the region. FIG. 8 is a plan view showing an example of a planar layout of the bonding pads BPdk on the bonding surface in the kerf region KR. In the example shown in FIG. 8, for simplicity of the explanation, the bonding surface in the kerf region KR is divided in a square grid pattern into square cells having a length L on each side. In this example, a bonding pad BPdk is arranged to correspond to one square cell. However, the bonding pad BPdk is not necessarily arranged to correspond to one square cell. The shape of the bonding pad BPdk on the XY plane is not necessarily a square.

As shown in FIG. 8, for example, the bonding pad BPdk is arranged to correspond to one square cell. In this case, the area of the bonding pad BPdk is $L^2$. In the following description, the area of electrodes constituting the bonding pads BPdk provided on the bonding surface of the array chip 10 or the circuit chip 20 is defined as the area of the bonding pads BPdk on the bonding surface. Alternatively, the bonding area of electrodes provided on the bonding surface of the array chip 10 and electrodes provided on the bonding surface of the circuit chip 20 may be defined as the area of the bonding pads BPdk on the bonding surface.

The bonding pads BPdk are arranged in a predetermined pattern. FIG. 8 shows an example of the pattern in which 15 bonding pads BPdk are arranged in a unit region UKR of 15×15 square cells. In this case, with respect to a square cell in which a reference bonding pad BPdk is arranged, another bonding pad BPdk is arranged in a square cell at a fourth position shifted in the X direction and a next position shifted in the Y direction, and still another bonding pad BPd is arranged in a square cell at a next position shifted in the X direction and a fourth position shifted in the Y direction. In other words, the bonding pads BPdk are arranged to form a triangular (or parallelogram) grid on the XY plane. The bonding pads BPdk are arranged to form lines in an A1 direction and an A2 direction which are different from both the X direction and the Y direction. The A1 direction and the A2 direction form an angle θ, which is smaller than 90 degrees. The angle θ and the distance between two bonding pads BPdk in each of the A1 direction and A2 direction are designed in accordance with the coverage. For example, the coverage is increased as the angle θ or the distance between two bonding pads BPdk is decreased.

Hereinafter, a pattern in which the bonding pads BP are arranged to be shifted from the X direction and the Y direction on the XY plane is referred to as a "staggered arrangement". The bonding pads BPdi in the dummy pad region DR and the bonding pads BPdo in the outer peripheral region OR are also staggered similarly to the bonding pads BPdk. Thus, the dummy pads are in the staggered arrangement.

For example, in a process of manufacturing the semiconductor device 1, the electrodes (metal material) constituting the bonding pads BP are polished by chemical mechanical polishing (CMP) on the bonding surface of the array chip 10 or the circuit chip 20. At this time, the flatness obtained by the CMP is improved by the staggered arrangement of the dummy pads as compared to a case in which the bonding pads BP are arranged in the X direction or the Y direction. Furthermore, in a bonding process for bonding a wafer on which the array chip 10 is formed and a wafer on which the circuit chip 20 is formed, the bonding progresses from a central portion toward a peripheral portion of the wafer. At this time, the rate of progression of bonding (bonding rate) varies depending on whether the bonding surface is formed of an insulator or a metal. Since the variation of the bonding rate is reduced by arranging the dummy pads in the staggered arrangement, a bonding failure is suppressed.

Next is a description of the coverage. The coverage of the bonding pads BPdk is calculated as a ratio of the area occupied by the bonding pads BPdk to the area of a unit region UKR. The coverage of the bonding pads BPdk on the bonding surface in the kerf region KR is designed to be 5% or more and 15% or less.

For example, in the CMP of the bonding surface, the amount of polishing in all regions including the bonding pads BP and insulating films between the bonding pads BP is increased as the coverage is increased. For example, if the coverage of the bonding pads BPdk in the kerf region KR is less than 5%, the amount of polishing in all regions of the kerf region KR is small relative to the amount of polishing in all regions of the outer peripheral region OR. Therefore, a step is likely to be formed on the bonding surface; that is, the kerf region KR projects from the outer peripheral region OR. If the step is formed, voids may occur in the bonding process near the boundary between the outer peripheral region OR and the kerf region KR, increasing the possibility of occurrence of a bonding failure.

If the coverage of the bonding pads BPdk in the kerf region KR on the bonding surface is greater than 15%, the ratio of the metal (the electrode) constituting the bonding pads BPdk in the kerf region KR is increased. Therefore, when the kerf region KR is cut with a blade or the like in the dicing process, chipping may easily occur and the chip cutting may be difficult.

1. 1. 8 Cross-sectional Structure of Semiconductor Device

Figure 9:
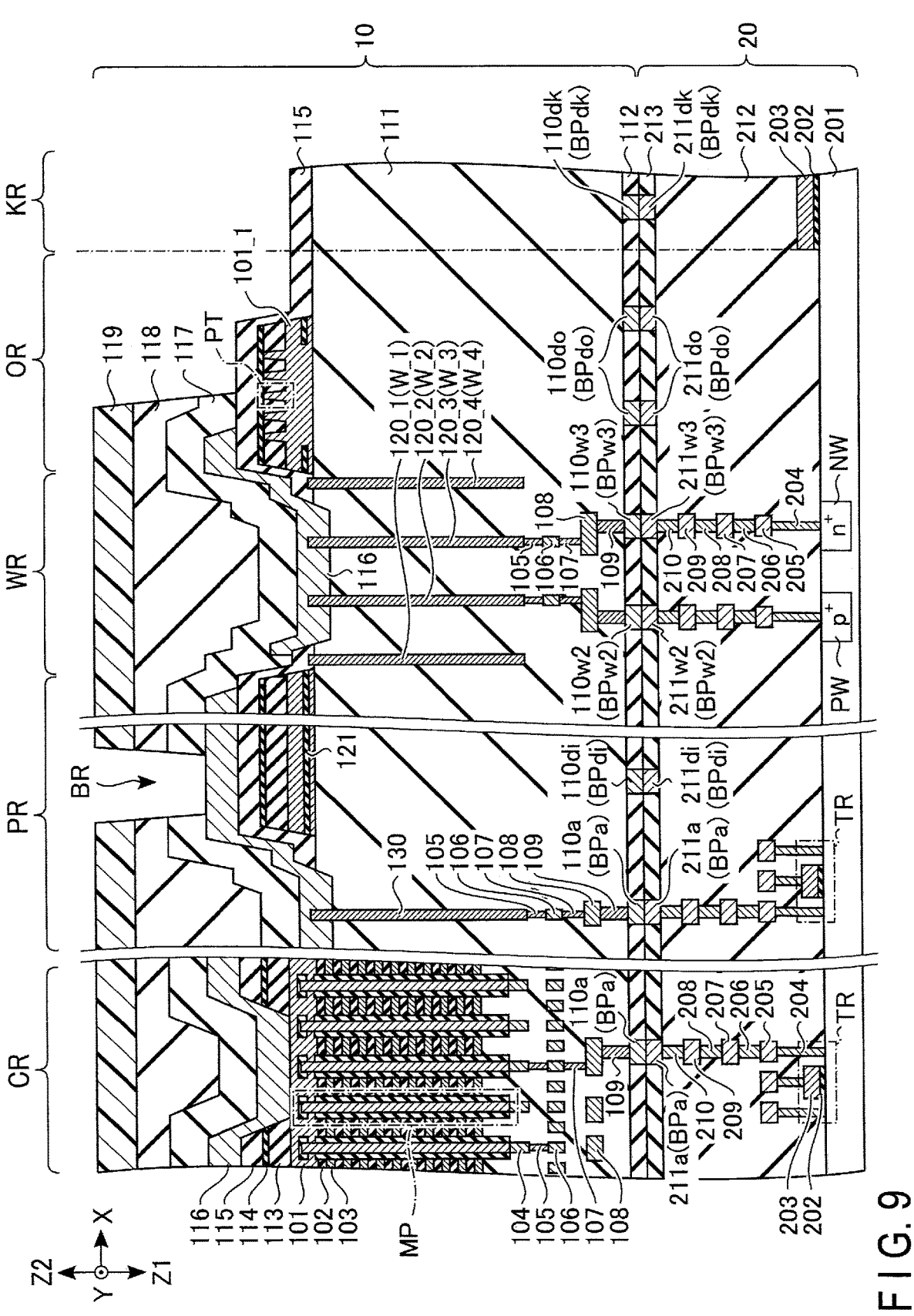
FIG. 9 is a cross-sectional view showing an example of a cross-sectional structure of the semiconductor device according to the first embodiment.

Next, an example of a cross-sectional structure of the semiconductor device 1 will be described with reference to FIG. 9. FIG. 9 is a cross-sectional view showing an example of the cross-sectional structure of the semiconductor device 1.

As shown in FIG. 9, the semiconductor device 1 has a bonding structure in which the array chip 10 and the circuit chip 20 are bonded. The array chip 10 includes a semiconductor layer 101, insulating layers 102, 111, 112, 113, 114, 115, 117, 118, and 121, interconnect layers 103, 106, 108, and 116, conductors 104, 105, 107, 109, 120, and 130, electrodes 110, a surface protective layer 119, and memory pillars MP. The electrodes 110 include electrodes 110a, 110di, 110w2, 110w3, 110do, and 110dk. The circuit chip 20 includes a semiconductor substrate 201, an N-type impurity diffusion region NW, a P-type impurity diffusion region PW, a transistor TR, a gate insulating film 202, a gate electrode 203, conductors 204, 206, 208, and 210, interconnect layers 205, 207, and 209, electrodes 211, and insulating layers 212 and 213. The electrodes 211 include electrodes 211a, 211di, 211w2, 211w3, 211do, and 211dk.

1. 1. 8. 1 Cross-Sectional Structure of Array Chip

Subsequently, a cross-sectional structure of the array chip 10 will be described with reference to FIG. 9.

1. 1. 8. 1. 1 Structure of Core Region

First, the core region CR of the array chip 10 will be described. The core region CR of the array chip 10 is provided with the memory cell array 11 and various interconnects for coupling the memory cell array 11 and the circuit chip 20.

The semiconductor layer 101 extends in the X direction and the Y direction. The semiconductor layer 101 provided in the core region CR functions as the source line SL. The semiconductor layer 101 contains, example, silicon. In the core region CR, a plurality of insulating layers 102 and a plurality of interconnect layers 103 are alternately stacked one by one on a top surface in the Z1 direction of the semiconductor layer 101. In the example of FIG. 9, ten insulating layers 102 and ten interconnect layers 103 are alternately stacked one by one. In other words, the plurality of interconnect layers 103 separate from each other in the Z direction are stacked between the circuit chip 20 and the semiconductor layer 101. The interconnect layers 103 extend in the X direction. The plurality of interconnect layers 103 function as the word lines WL, and the select gate lines SGD and SGS, respectively. The insulating layers 102 contain silicon oxide (SiO) as an insulating material. The interconnect layers 103 contain, for example, tungsten (W) as a conductive material.

A plurality of memory pillars MP are provided in the core region CR. One memory pillar MP corresponds to one NAND string NS. For example, the memory pillar MP has a cylindrical shape extending in the Z direction. The memory pillar MP penetrates (passes through) the insulating layers 102 and the interconnect layers 103. An end portion (bottom surface) in the Z2 direction of each memory pillar MP reaches the semiconductor layer 101. The memory pillar MP includes a semiconductor layer extending in the Z direction. A part of the semiconductor layer in the memory pillar MP is in contact with the semiconductor layer 101. Details of the structure of the memory pillar MP will be described later.

The conductor 104 is provided on a top surface in the Z1 direction of each of the memory pillars MP. For example, the conductor 104 has a cylindrical shape extending in the Z direction. The conductor 105 is provided on a top surface in the Z1 direction of the conductor 104. For example, the conductor 105 provided in the core region CR has a cylindrical shape extending in the Z direction. Furthermore, the interconnect layer 106 is provided on a top surface in the Z1 direction of the conductor 105. For example, the core region CR is provided with a plurality of interconnect layers 106 arranged side by side in the X direction, and each extending in the Y direction. Each of the plurality of memory pillars MP is electrically coupled to any one of the plurality of interconnect layers 106 via the conductors 104 and 105. The interconnect layer 106 to which the memory pillar MP is coupled functions as a bit line BL. The conductors 104 contain, for example, tungsten. The conductors 105 and the interconnect layers 106 contain, for example, copper (Cu).

The conductor 107 is provided on a top surface in the Z1 direction of the interconnect layer 106. For example, the conductor 107 provided in the core region CR has a cylindrical shape extending in the Z direction. The conductor 108 is provided on a top surface in the Z1 direction of the conductor 107. The conductor 109 is provided on a top surface in the Z1 direction of the interconnect layer 108. For example, the conductor 109 provided in the core region CR has a cylindrical shape extending in the Z direction. In the core region CR, an electrode 110a is provided on a top surface in the Z1 direction of the conductor 109. The electrode 110a is in contact with the electrode 211a of the circuit chip 20. The electrodes 110a and 211a function as bonding pads BPa.

Each of the plurality of interconnect layers 106 in the core region CR is electrically coupled to any one of the electrodes 110a via the conductor 107, the interconnect layer 108, and the conductor 109. The conductors 107 and 109, interconnect layer 108, and electrode 110a contain, for example, copper as conductive material. The number of interconnect layers provided between the interconnect layer 106 and the electrode 110a is discretionary.

Although not illustrated in FIG. 9, the core region CR includes an additional electrode 110a electrically coupling the interconnect layer 103 and the circuit chip 20, in addition to the aforementioned electrode 110a electrically coupling the memory pillar MP (and the interconnect layer 106) and the circuit chip 20.

The insulating layer 111 is provided so as to cover the insulating layers 102, interconnect layers 103, memory pillars MP, conductors 104, conductors 105, interconnect layers 106, conductors 107, interconnect layers 108, and conductors 109. The insulating layer 112 is provided on a top surface in the Z1 direction of the insulating layer 111. The electrodes 110a are provided in the same layer as the insulating layer 112. The insulating layer 112 is in contact with the insulating layer 213 of the circuit chip 20. The plane where the insulating layer 112 and the insulating layer 213 are in contact with each other corresponds to the bonding surface.

The insulating layers 113 and 114 are stacked on a top surface in the Z2 direction of the semiconductor layer 101. Then, the insulating layer 115 is provided so as to cover the semiconductor layer 101 and the insulating layers 113 and 114. The insulating layers 113 and 115 contain, for example, a silicon oxide as an insulating material. For the insulating layer 114, an insulating material with a function of preventing oxidation of metal (e.g., Cu) is used. The insulating layer 114 contains, for example, silicon carbonitride (SiCN) or silicon nitride (SiN). The insulating layer 114 may be omitted.

The interconnect layer 116 is provided on a top surface in the Z2 direction of the insulating layer 115. The interconnect layer 116 provided in the core region CR is in contact with the semiconductor layer 101 in a region where the insulating layers 113 to 115 on the semiconductor layer 101 are removed. The interconnect layer 116 provided in the core region CR is in contact with the semiconductor layer 101, thereby functioning as a part of an interconnect layer that electrically couples the semiconductor layer 101 (source line SL) and the circuit chip 20. The interconnect layer 116 contains, for example, aluminum (Al).

The insulating layer 117 is provided on a top surface in the Z2 direction of the interconnect layer 116. The insulating layer 118 is provided on a top surface in the Z2 direction of the insulating layer 117. Then, the surface protective layer 119 is provided on a top surface in the Z2 direction of the insulating layer 118. The insulating layers 117 and 118 and the surface protective layer 119 are provided so as to cover the element region ER, the wall region WR, and an inner peripheral portion of the outer peripheral region OR. That is, in an outer peripheral portion of the outer peripheral region OR and the kerf region KR, the insulating layers 117 and 118 and the surface protective layer 119 are removed. The insulating layer 117 contains, for example, silicon oxide as an insulating material. The insulating layer 118 contains, for example, silicon nitride as an insulating material having a low water permeability. The surface protective layer 119 contains, for example, a resin material such as polyimide.

1. 1. 8. 1. 2 Structure of Peripheral Circuit Region

Next, the peripheral circuit region PR of the array chip 10 will be described. The peripheral circuit region PR of the array chip 10 includes an external connection terminal region BR where an external connection terminal is provided. In the external connection terminal region BR, the insulating layers 117 and 118 and the surface protective layer 119 are removed to expose a part of the interconnect layer 116. The interconnect layer 116 that functions as an external connection terminal is coupled to the conductor 130. For example, the conductor 130 has a cylindrical shape extending in the Z direction. In the Z1 direction, the conductor 130 is electrically coupled to any of the electrodes 110a via the conductor 105, the interconnect layer 106, the conductor 107, the interconnect layer 108, and the conductor 109. In other words, the peripheral circuit region PR includes the electrode 110a to electrically couple the circuit chip 20 to an external device.

A plurality of electrodes 110di are provided in the same layer as the insulating layer 112 in the dummy pad region DR in the core region CR and the peripheral circuit region PR. Each of the electrodes 110di is in contact with the corresponding electrode 211di of the circuit chip 20. The electrodes 110di and 211di function as bonding pads BPdi. The plurality of electrodes 110di are electrically insulated from the memory cell array 11 and various interconnects in the array chip 10 and from the semiconductor substrate 201 and various interconnects in the circuit chip 20. In other words, the electrodes 110di are dummy electrodes.

The insulating layer 121 is provided inside the semiconductor layer 101 in the peripheral circuit region PR. The insulating layer 121 has a three-layer structure formed of a layer containing a silicon oxide, a layer containing a silicon nitride, and a layer containing a silicon oxide. The semiconductor layer 101 in the peripheral circuit region PR does not function as a source line SL.

1. 1. 8. 1. 3 Structure of Wall Region

Next, the wall region WR of the array chip 10 will be described. The wall region WR of the array chip 10 is provided with wall structures W and various interconnects for coupling the wall structures W to the circuit chip 20. The wall structures W include, for example, wall structures W_1, W_2, W_3, and W_4. The wall structures W_1 to W_4 respectively include conductors 120_1 to 120_4.

A planar layout of the conductors 120_1 to 120_4 will be described with reference to FIG. 10. FIG. 10 is a plan view showing an example of the planar layout of the conductors 120_1 to 120_4. For simplicity of explanations, elements other than the conductors 120_1 to 120_4 are omitted from FIG. 10. As shown in FIG. 10, for example, the conductors 120_1 to 120_4 each have an approximately square ring shape on the XY plane. The conductors 120_1 to 120_4 are not in contact with each other. The conductors 120_1 to 120_4 may not be square ring-shaped as long as they are ring-shaped. The conductor 120_1 is provided so as to surround the element region ER (the peripheral circuit region PR). The conductor 120_2 is provided so as to surround the conductor 120_1. The conductor 120_3 provided so as to surround the conductor 120_2. The conductor 120_4 is provided so as to surround the conductor 120_3.

As shown in FIG. 9, the conductors 120_1 to 120_4 each extend in the Z direction. For example, one end portion in the Z2 direction of each of the conductors 120_1 and 120_4 is in contact with the insulating layer 115. The end portions in the Z2 direction of the conductors 120_1 and 120_4 may be in contact with the semiconductor layer 101 or the interconnect layer 116, or may be inside the insulating layer 111. One end portion in the Z2 direction of each of the conductors 120_2 and 120_3 is in contact with the interconnect layer 116, for example, in the region from which the semiconductor layer 101 and the insulating layers 113 to 115 have been removed.

The interconnect layer 116 provided in the wall region WR is electrically insulated from the interconnect layer 116 provided in the core region CR and the interconnect layer 116 provided in the peripheral circuit region PR. The interconnect layer 116 provided in the wall region WR is covered by the surface protective layer 119, etc.

One end portion in the Z1 direction of each of the conductors 120_1 and 120_4 is not coupled to the conductor 105. One end portion in the Z1 direction of the conductor 120_2 is electrically coupled to the electrode 110w2 via the conductor 105, the interconnect layer 106, the conductor 107, the interconnect layer 108, and the conductor 109. The electrode 110w2 is in contact with the electrode 211w2 of the circuit chip 20. Similarly, one end portion in the Z1 direction of the conductor 120_3 is electrically coupled to the electrode 110w3 via the conductor 105, the interconnect layer 106, the conductor 107, the interconnect layer 108, and the conductor 109. The electrode 110w3 is in contact with the electrode 211w3 of the circuit chip 20.

The conductor 105, the interconnect layer 106, the conductor 107, the interconnect layer 108, the conductor 109, the electrode 110w2, and the electrode 211w2, which are electrically coupled to the conductor 120_2, can form a square ring shape surrounding the element region ER. For example, on the XY plane, the interconnect layer 108 electrically coupled to the conductor 120_2 has a width greater than that of the interconnect layer 106 electrically coupled to the conductor 120_2.

The conductor 105, the interconnect layer 106, the conductor 107, the interconnect layer 108, the conductor 109, the electrode 110w3, and the electrode 211w3, which are electrically coupled to the conductor 120_3, can each form a square ring shape surrounding the conductor 105, the interconnect layer 106, the conductor 107, the interconnect layer 108, the conductor 109, the electrode 110w2, and the electrode 211w2, which are electrically coupled to the conductor 120_2. For example, on the XY plane, the interconnect layer 108 electrically coupled to the conductor 120_3 has a width greater than that of the interconnect layer 106 electrically coupled to the conductor 120_3. The electrodes 110w2 and 211w2 function as bonding pads BPw2. The electrodes 110w3 and 211w3 function as bonding pads BPw3.

1. 1. 8. 1. 4 Structure of Outer Peripheral Region

Next, the outer peripheral region OR of the array chip 10 will be described. In the outer peripheral region OR of the array chip 10, a plurality of electrodes 110do are provided in the same layer as the insulating layer 112. Each of the electrodes 110do is in contact with the corresponding electrode 211do of the circuit chip 20. The electrodes 110do and 211do function as bonding pads BPdo. The plurality of electrodes 110do are electrically insulated from the various interconnects in the array chip 10 and from the various interconnects in the circuit chip 20. In other words, the electrodes 110do are dummy electrodes.

The semiconductor layer 101 provided in the outer peripheral region OR is electrically insulated from the semiconductor layer 101 provided in the core region CR and the semiconductor layer 101 provided in the peripheral circuit region PR. Hereinafter, in a case where the semiconductor layer 101 provided in the outer peripheral region OR is to be specifically identified, it is represented as the semiconductor layer 101_1. At least a part of the semiconductor layer 101_1 is not covered (protected) by the surface protective layer 119. That is, at least a part of the semiconductor layer 101_1 is not provided between the circuit chip 20 and the surface protective layer 119 in the Z direction. In other words, a part of the outer peripheral region OR is not surface-protected by the surface protective layer 119.

On a top surface in the Z2 direction of the semiconductor layer 101_1, a plurality of protruding portions PT extending in the Z2 direction are provided. The protruding portions PT, for example, penetrate the insulating layer 113. Top surfaces in the Z2 direction of the protruding portions PT are in contact with the insulating layer 114. A part of the insulating layer 121 that is provided inside the semiconductor layer 101_1 and that overlaps the protruding portions PT in the Z direction is removed and separate by the semiconductor layer 101_1. The protruding portions PT ground the semiconductor layer 101 on the substrate (not shown) of the array chip 10 during the manufacturing process of the array chip 10. For example, the protruding portions PT are used to suppress an occurrence of arcing due to charging-up of the semiconductor layer 101 during dry etching. The protruding portions PT may not be provided.

1. 1. 8. 1. 5 Structure of Kerf Region

Next, the kerf region KR of the array chip 10 will be described. In the kerf region KR of the array chip 10, a plurality of electrodes 110dk are formed in the same layer as the insulating layer 112. Each of the electrodes 110dk is in contact with the corresponding electrode 211dk of the circuit chip 20. The electrodes 110dk and 211dk function as bonding pads BPdk. The plurality of electrodes 110dk are electrically insulated from the various interconnects in the array chip 10 and from the various interconnects in the circuit chip 20. In other words, the electrodes 110dk are dummy electrodes.

The kerf region KR does not include the semiconductor layer 101 and the interconnect layer 116, and the surface protective layer 119 that protects these layers.

1. 1. 8. 2 Cross-sectional Structure of Circuit Chip

Next, a cross-sectional structure of the circuit chip 20 will be described.

In the element region ER (the core region CR and the peripheral circuit region PR), a plurality of transistors TR are provided on a top surface in the Z2 direction of the semiconductor substrate 201. The transistors TR are used as elements in the sequencer 21, the voltage generator 22, the row decoder 23, the sense amplifier 24, etc. The transistors TR each include the gate insulating film 202, the gate electrode 203, and the source and drain (not shown) formed in the semiconductor substrate 201. The gate insulating film 202 is provided on a top surface in the Z2 direction of the semiconductor substrate 201. The gate electrode 203 is provided on a top surface in the Z2 direction of the gate insulating film 202.

The gate insulating film 202 and the gate electrode 203 are not provided in the wall region WR and the outer peripheral region OR. The gate insulating film 202 and the gate electrode 203 that do not function as a part of the transistor TR are provided in the kerf region KR. The gate insulating film 202 and the gate electrode 203 in the kerf region KR that do not function as a part of the transistor TR are used, for example, for forming an alignment mark. The boundary between the kerf region KR and the outer peripheral region OR may be defined by the end portion of the gate electrode 203 that does not function as a part of the transistor TR.

In the element region ER, the conductors 204 are provided on top surfaces in the Z2 direction of the gate electrode 203, the source, and the drain. In the wall region WR, the conductors 204 are provided on top surfaces in the Z2 direction of the N-type impurity diffusion region NW provided in the semiconductor substrate 201, and the P-type impurity diffusion region PW provided in the semiconductor substrate 201.

The interconnect layer 205 is provided on a top surface in the Z2 direction of the conductor 204. The conductor 206 is provided on a top surface in the Z2 direction of the interconnect layer 205. The interconnect layer 207 is provided on a top surface in the Z2 direction of the conductor 206. The conductor 208 is provided on a top surface in the Z2 direction of the interconnect layer 207. The interconnect layer 209 is provided on a top surface in the Z2 direction of the conductor 208. The conductor 210 is provided on a top surface in the Z2 direction of the interconnect layer 209. For example, the conductors 204, 206, 208, and 210 provided in the element region ER each have a cylindrical shape extending in the Z direction. The conductors 204, 206, 208, and 210 and the interconnect layers 205, 207, and 209 provided in the wall region WR form, for example, a square ring shape surrounding the element region ER. The N-type impurity diffusion region NW and the P-type impurity diffusion region PW provided in the wall region WR may similarly form a square ring shape, or may be provided to form a plurality of regions separate from each other along a square ring shape so as to surround the element region ER. The number of interconnect layers provided in the circuit chip 20 is discretionary.

The insulating layer 212 is provided on a top surface in the Z2 direction of the semiconductor substrate 201. The insulating layer 212 is provided so as to cover the transistors TR, conductors 204, interconnect layers 205, conductors 206, interconnect layers 207, conductors 208, interconnect layers 209, and conductors 210. The insulating layer 213 is provided on a top surface in the Z2 direction of the insulating layer 212.

The electrode 211*a* is provided in the same layer as the insulating layer 213 on a top surface in the Z2 direction of the conductor 210 provided in the active pad region AR in the element region ER. The electrode 211*di* is provided in the same layer as the insulating layer 213 in the dummy pad region DR in the element region ER. The electrodes 211*w*2 and 211*w*3 are provided in the same layer as the insulating layer 213 on a top surface in the Z2 direction of the conductor 210 provided in the wall region WR. The electrode 211*w*2 has a square ring shape surrounding the element region ER. The electrode 211*w*3 has a square ring shape surrounding the electrode 211*w*2. In the outer peripheral region OR, the electrode 211*do* is provided in the same layer as the insulating layer 213. In the kerf region KR, the electrode 211*dk* is provided in the same layer as the insulating layer 213. The plurality of electrodes 211*di*, 211*do*, and 211*dk* are electrically insulated from the various interconnects in the array chip 10 and from the various interconnects in the circuit chip 20. In other words, the electrodes 211*di*, 211*do*, and 211*dk* are dummy electrodes.

The gate electrodes 203, the conductors 204, 206, 208, and 210, the interconnect layers 205, 207, and 209, and the electrode 211*a*, 211*di*, 211*do*, 211*w*2, 211*w*3, and 211*dk* are composed of conductive materials, and may contain metallic materials, p-type or n-type semiconductors, etc. The electrodes 211*a*, 211*di*, 211*do*, 211*w*2, 211*w*3, and 211*dk* contain, for example, copper. The gate insulating film 202, the insulating layer 212, and the insulating layer 213 contain, for example, a silicon oxide as an insulating material.

In the example shown in FIG. 9, the conductor 120_2 of the array chip 10 is electrically coupled to the P-type impurity diffusion region PW in the semiconductor substrate 201 of the circuit chip 20 via the electrodes 110*w*2 and 211*w*2. The conductor 120_3 in the array chip 10 is electrically coupled to the N-type impurity diffusion region NW in the semiconductor substrate 201 of the circuit chip 20 via the electrodes 110*w*3 and 211*w*3. The conductor 120_3 may be electrically coupled to the P-type impurity diffusion region PW, and the conductor 120_2 may be electrically coupled to the N-type impurity diffusion region NW.

1. 1. 9 Cross-Sectional Structure of Bonding Pad

Next, a cross-sectional structure of the bonding pads BP will be described with reference to FIG. 11. FIG. 11 is a cross-sectional view showing an example of a cross-sectional structure of the bonding pad BP. FIG. 11 shows an example of the electrodes 110*dk* and 211*dk* included in the bonding pad BPdk in the kerf region KR. The following explanations relating to the bonding pad BPdk are also applicable to the bonding pads BPa, BPdi, BPw2, BPw3, and BPdo.

As shown in FIG. 11, during the process of bonding the array chip 10 and the circuit chip 20, the electrode 110*dk* is coupled to the electrode 211*dk*. In the example shown in FIG. 11, the area of the electrode 110*dk* and the area of the electrode 211*dk* on the bonding surface are approximately equal. In such a case, if copper is used in the electrode 110*dk* and the electrode 211*dk*, the copper in the electrode 110*dk* and the copper in the electrode 211*dk* may be unified, which may make it difficult to observe the boundary between the copper portions. However, the location of bonding can be confirmed by observing distortion of the shape of the bonded-together electrodes 110*dk* and 211*dk* due to misalignment of the bonding and misalignment of a copper barrier metal (generation of a discontinuous portion on a side surface).

In a case where the electrodes 110*dk* and 211*dk* are formed by the damascene method, their respective side surfaces have a tapered shape. Thus, the shape of a cross section along the Z direction at the portion where the electrodes 110*dk* and 211*dk* are bonded together is a non-rectangular shape which does not have a straight side wall.

Further, if the electrodes 110*dk* and 211*dk* are bonded together, the barrier metal covers the bottom, side, and top surfaces of copper that forms these bonded-together electrodes 110*dk* and 211*dk*. In contrast, in general interconnect layers using copper, an insulating layer (SiN or SiCN, etc.) with a function of preventing oxidation of copper is provided on the top surface of Cu, and no barrier metal is provided. Therefore, even if no misalignment of the bonding occurs, it is possible to distinguish the bonding from the general interconnect layers.

1. 1. 10 Cross-Sectional Structure of Memory Cell Array

Next, an example of a cross-sectional structure of the memory cell array 11 will be described with reference to FIG. 12. FIG. 12 is a cross-sectional view showing an example of a cross-sectional structure of the memory cell array 11. FIG. 12 shows two memory pillars MP included in the memory cell array 11.

As shown in FIG. 12, for example, the semiconductor layer 101 includes three semiconductor layers 101*a*, 101*b*, and 101*c*. The semiconductor layer 101*b* is provided on a top surface in the Z1 direction of the semiconductor layer 101*a*. The semiconductor layer 101*c* is provided on a top surface in the Z1 direction of the semiconductor layer 101*b*. For example, the semiconductor layer 101*b* is formed by replacing the insulating layer 121 provided between the semiconductor layer 101*a* and the semiconductor layer 101*c*. The semiconductor layers 101*a* to 101*c* contain, for example, silicon. Further, the semiconductor layers 101*a* to 101*c* contain phosphorus (P) as an impurity for a semiconductor.

On a top surface in the Z1 direction of the semiconductor layer 101, ten insulating layers 102 and ten interconnect layers 103 are alternately stacked one by one. In the example of FIG. 12, the ten interconnect layers 103 function as a select gate line SGS, word lines WL0 to WL7, and a select gate line SGD in order from the side closer to the semiconductor layer 101. A plurality of interconnect layers 103 that function as the select gate line SGS or the select gate line SGD may be provided. For example, a stacked structure of titanium nitride (TiN)/tungsten (W) may be used as a conductive material of the interconnect layers 103. In this case, titanium nitride is formed so as to cover tungsten. Titanium nitride functions as a barrier layer to suppress oxidation of tungsten or as an adhesion layer to improve adhesion of tungsten, when tungsten is deposited by, for example, a chemical vapor deposition (CVD). The interconnect layers 103 may contain a high dielectric constant material such as aluminum oxide (AlO). In this case, the high dielectric constant material is formed so as to cover the conductive material. For example, in each of the interconnect layers 103, the high dielectric constant material is provided so as to be in contact with the insulating layers 102 provided above and below each interconnect layer 103 and the side surface of the memory pillar MP. Then, titanium nitride is provided so as to be in contact with the high dielectric constant material. Tungsten is then provided so as to be in contact with titanium nitride and fill the inside of each interconnect layer 103.

The insulating layer 111 is provided on a top surface in the Z1 direction of the interconnect layer 103 that functions as the select gate line SGD.

The plurality of memory pillars MP are provided in the memory cell array 11. The memory pillars MP each have an approximately cylindrical shape extending in the Z direction. The memory pillars MP each penetrate the ten interconnect layers 103. The bottom surface of each memory pillar MP reaches the semiconductor layer 101. The memory pillars MP may each have a structure in which a plurality of pillars are connected in the Z direction.

Next, an internal configuration of the memory pillar MP will be described. The memory pillar MP includes a block insulating film 140, a charge storage film 141, a tunnel insulating film 142, a semiconductor film 143, a core film 144, and a cap film 145.

The block insulating film 140, the charge storage film 141, and the tunnel insulating film 142 are stacked in this order from the outer side on a part of the side surface and the bottom surface in the Z2 direction of the memory pillar MP. Specifically, in the same layer as the semiconductor layer 101*b* and the vicinity thereof, the block insulating film 140, the charge storage film 141, and the tunnel insulating film 142 on the side surface of the memory pillar MP are removed. The semiconductor film 143 is provided so as to be in contact with the side surface and the bottom surface of the tunnel insulating film 142 and the semiconductor layer 101*b*. The semiconductor film 143 is a region in which channels of the memory cell transistors MC and the select transistors ST1 and ST2 are to be formed. The inside of the semiconductor film 143 is filled with the core film 144. On top in the Z1 direction of the memory pillar MP, the cap film 145 is formed on top ends of the semiconductor film 143 and the core film 144. The side surface of the cap film 145 is in contact with the tunnel insulating film 142. The semiconductor film 143 and the cap film 145 both contain, for example, silicon. The conductor 104 is provided on a top surface in the Z1 direction of the cap film 145. The conductor 105 is provided on a top surface in the Z1 direction of the conductor 104. The conductor 105 is coupled to the interconnect layer 106.

FIG. 13 is a cross-sectional view taken along line XI-XI in FIG. 12, showing an example of a cross-sectional structure of the memory pillar MP. More specifically, FIG. 13 shows a cross-sectional structure of the memory pillar MP in a layer that includes the interconnect layer 103.

In the cross section including the interconnect layer 103, the core film 144 is provided, for example, at the center of the memory pillar MP. The semiconductor film 143 surrounds the side surface of the core film 144. The tunnel insulating film 142 surrounds the side surface of the semiconductor film 143. The charge storage film 141 surrounds the side surface of the tunnel insulating film 142. The block insulating film 140 surrounds the side surface of the charge storage film 141. The interconnect layer 103 surrounds the side surface of the block insulating film 140.

The semiconductor film 143 serves as a channel (current path) for the memory cell transistors MC0 to MC7 and the select transistors ST1 and ST2. The tunnel insulating film 142 and the block insulating film 140 both contain, for example, a silicon oxide. The charge storage film 141 has a function of accumulating charges. The charge storage film 141 contains, for example, silicon nitride.

The memory pillar MP in combination with the interconnect layers 103 respectively functioning as the word lines WL0 to WL7 forms the memory cell transistors MC0 to MC7. Similarly, the memory pillar MP in combination with the interconnect layer 103 functioning as the select gate line SGD forms the select transistor ST1. The memory pillar MP in combination with the interconnect layer 103 functioning as the select gate line SGS forms the select transistor ST2. With these components, the memory pillars MP are each capable of functioning as one NAND string NS.

1. 2 Advantageous Effects of Present Embodiment

The first embodiment can improve the manufacturing yield of the semiconductor device 1. This effect will be described below.

According to the configuration of this embodiment, the semiconductor device 1 includes the bonding pads BPdk on the bonding surface in the kerf region KR. The coverage of the bonding pads BPdk on the bonding surface in the kerf region KR is designed to be 5% or more and 15% or less. By setting the coverage to 5% or more, the formation of a step between the kerf region KR and the outer peripheral region OR can be suppressed in the CMP process on the bonding surface of the array chip 10 and the circuit chip 20. The occurrence of a bonding failure in the process of bonding the array chip 10 and the circuit chip 20 can be reduced. Furthermore, by setting the coverage to 15% or less, the occurrence of a failure of chip cutting in the dicing process can be suppressed. Therefore, the manufacturing yield of the semiconductor device 1 can be improved.

In addition, according to the configuration of this embodiment, the dummy pads can be arranged in the staggered arrangement. Accordingly, the reduction of flatness in the CMP on the bonding surface and the occurrence of a bonding failure in the bonding process can be suppressed.

1. 3 Modifications of First Embodiment

Next, three modifications of the first embodiment will be described below. Hereinafter, differences from the first embodiment will be mainly explained.

1. 3. 1 First Modification

First, a first modification of the first embodiment will be described with reference to FIG. 14. In the first modification described below, the bonding pads BPw2 and BPw3 are different in shape from those of the first embodiment. FIG. 14 is a plan view of the bonding surface.

As shown in FIG. 14, the bonding pad BPw2 does not necessarily have a continuous ring shape. For example, a plurality of bonding pads BPw2 may be arranged in a ring shape. Similarly, a plurality of bonding pads BPw3 may be arranged in a ring shape. Neither or either one of the bonding pads BPw2 and BPw3 may have a continuous ring shape.

1. 3. 2 Second Modification

Figure 15:
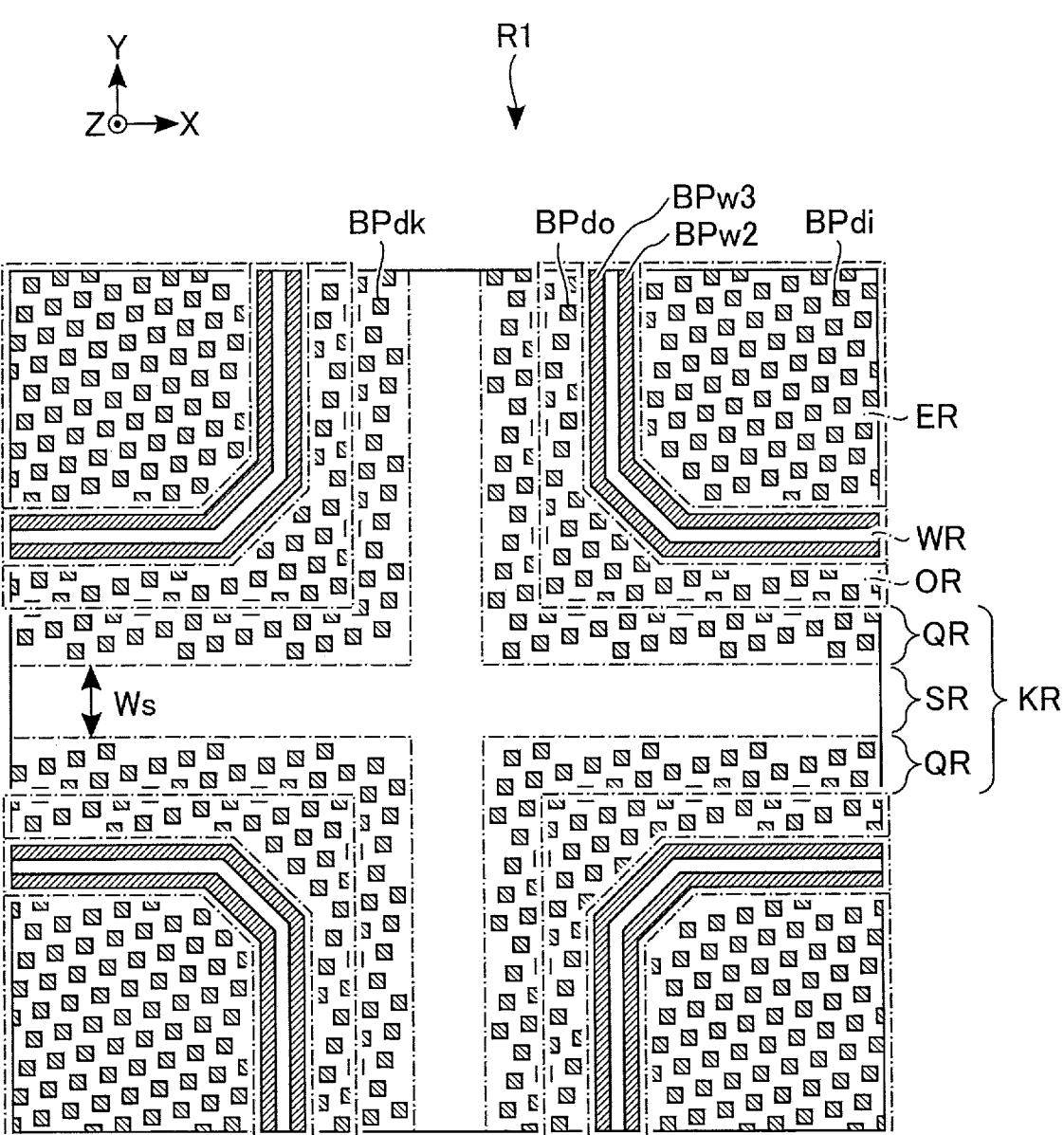
FIG. 15 is an enlarged view of a bonding surface in an intersection region of kerf regions in the semiconductor device according to a second modification of the first embodiment.

Next, a second modification will be described with reference to FIG. 15. In the second modification described below, the bonding pad BPdk on the bonding surface in the kerf region KR is different in layout from that of the first embodiment. FIG. 15 is an enlarged view of the bonding surface in an intersection region R1 of kerf regions KR.

As shown in FIG. 15, the bonding surface in the kerf regions KR between a plurality of semiconductor devices 1 before the dicing process includes a region SR in a central portion where the bonding pads BPdk are not arranged and a region QR between the region SR and the outer peripheral region OR where the bonding pads BPdk are arranged. The region SR corresponds to a region that is cut by a blade in the dicing process. Preferably, the region SR has a width Ws greater than the width of the blade. Forming the region SR can suppress the occurrence of failures during chip cutting.

FIG. 16 is a plan view of the bonding surface of the semiconductor device 1 in a case where a plurality of semiconductor devices 1 are cut into chips with a blade thinner than the width of the region SR.

As shown in FIG. 16, in the kerf region KR including the chip end portion, the bonding pads BPdk are arranged in the region QR where no chip cut surface is formed. On the other hand, the bonding pads BPdk are not arranged in the region SR located in an outermost edge adjacent to the chip cut surface. In other words, the region QR is an electrode arrangement region in which the electrodes 110dk and 211dk (bonding pads BPdk) are arranged. The region SR is an outermost edge region which surrounds the electrode arrangement region and in which no electrode (bonding pads BPdk) is arranged.

1. 3. 3 Third Modification

Next, a third modification of the first embodiment will be described. In the third modification described below, a crack stopper is provided in the outer peripheral region OR.

1. 3. 3. 1 Planar Layout of Bonding Surface

First, an example of the planar layout of the bonding surface will be described with reference to FIGS. 17 and 18. FIG. 17 is a plan view of the bonding surface. FIG. 18 is an enlarged view of the bonding surface in an intersection region R1 of kerf regions KR.

As shown in FIGS. 17 and 18, a bonding pad BPw5 and a plurality of bonding pads BPdo are arranged in the outer peripheral region OR. For example, the bonding pad BPw5 has an approximately square ring shape. Similarly to the bonding pads BPw2 and BPw3 in the first modification of the first embodiment, the bonding pad BPw5 does not necessarily have a continuous ring shape. For example, the bonding pads BPw5 are arranged so as to surround the wall region WR. The bonding pads BPdo may or may not be arranged between the bonding pad BPw3 of the wall region WR and the bonding pad BPw5. The bonding pads BPdo are arranged between the bonding pad BPw5 and the bonding surface in the kerf region KR.

1. 3. 3. 2 Cross-Sectional Structure of Semiconductor Device

Figure 19:
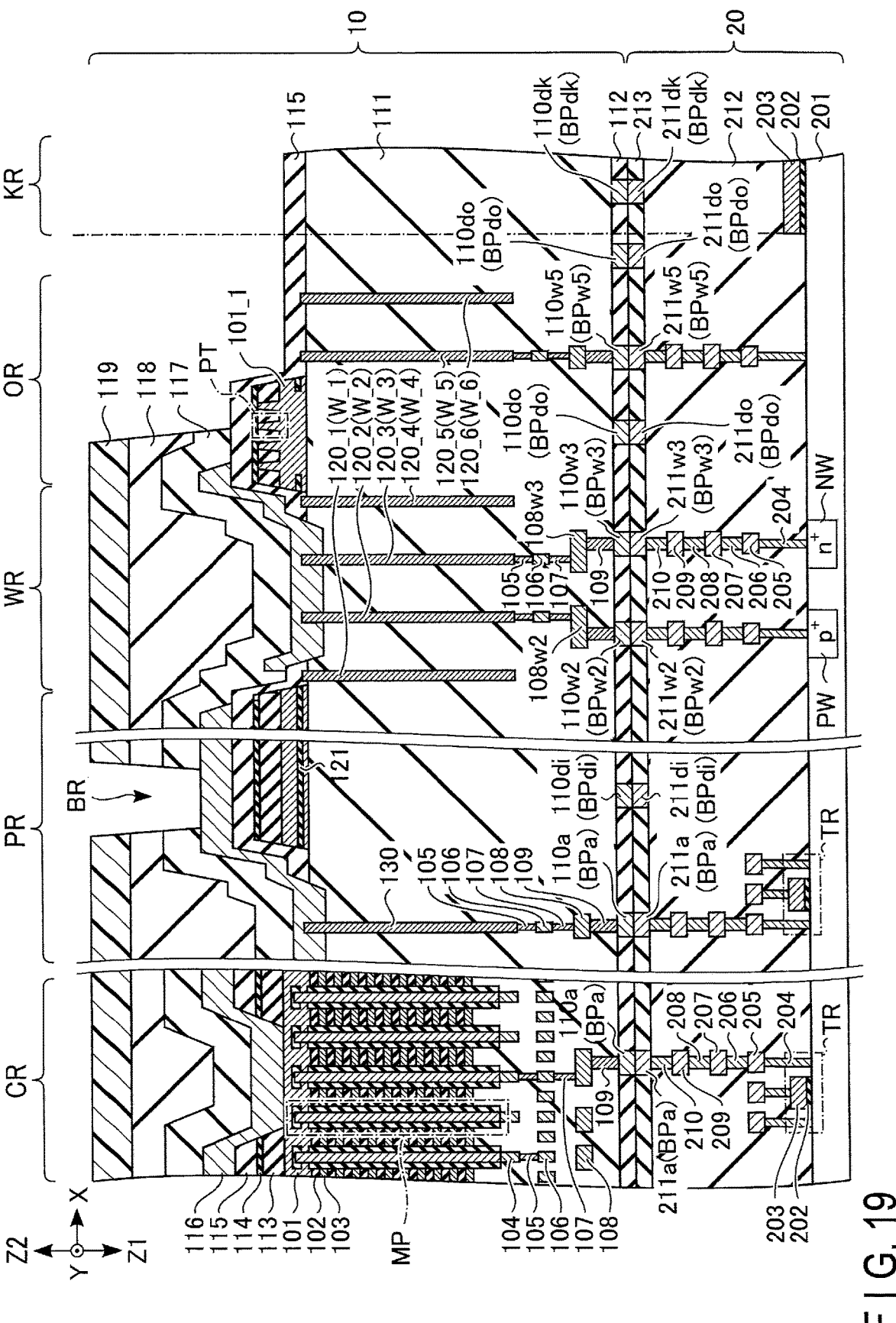
FIG. 19 is a cross-sectional view showing an example of a cross-sectional structure of the semiconductor device according to the third modification of the first embodiment.

Next, an example of a cross-sectional structure of the semiconductor device 1 will be described. FIG. 19 is a cross-sectional view showing an example of the cross-sectional structure of the semiconductor device 1.

As shown in FIG. 19, the structures of the core region CR, the peripheral circuit region PR, the wall region WR, and the kerf region KR are the same as those of the first embodiment shown in FIG. 9.

The outer peripheral region OR of the array chip 10 is provided with wall structures W_5 and W_6 and various interconnects for coupling the wall structure W_5 to the circuit chip 20. The wall structures W_5 and W_6 respectively include conductors 120_5 and 120_6. The number of wall structures W provided in the outer peripheral region OR is not limited to two.

When a crack, peeling of an insulating layer, etc. occurs at an end portion of the semiconductor device 1 in a dicing process, the wall structures W_5 and W_6 function as a crack stopper that inhibits the crack or peeling from reaching the element region ER. Furthermore, the wall structures W_5 and W_6 also inhibit water, etc. from penetrating from the end portion of the semiconductor device 1 to the interior. For example, by providing the wall structures W_5 and W_6 in the outer peripheral region OR (the region from which the surface protective layer 119, etc. have been removed), cracks or moisture, etc. that have developed from the end portion of the semiconductor device 1 are guided above (i.e., outside) the semiconductor device 1 in the outer peripheral region OR. In order to facilitate the guiding of cracks or moisture, etc. to the outside of the semiconductor device 1, the insulating layers 117 and 118 and the surface protective layer 119 are removed from an outer peripheral portion of the outer peripheral region OR.

Next, a planar layout of the conductors 120_1 to 120_6 will be described with reference to FIG. 20. FIG. 20 is a plan view showing an example of the planar layout of the conductors 120_1 to 120_6. For simplicity of explanations, elements other than the conductors 120_1 to 120_6 are omitted from FIG. 20.

As shown in FIG. 20, for example, the conductors 120_5 and 120_6 each have an approximately square ring shape on the XY plane. The conductors 120_5 and 120_6 are not in contact with each other. The conductors 120_5 and 120_6 may not be square as long as they are ring-shaped. The conductor 120_5 is provided so as to surround the wall region WR. The conductor 120_6 is provided so as to surround the conductor 120_5.

As shown in FIG. 19, the conductors 120_5 and 120_6 each extend in the Z direction. For example, one end portion in the Z2 direction of each of the conductors 120_5 and 120_6 is in contact with the insulating layer 115. The end portions in the Z2 direction of the conductors 120_5 and 120_6 may be inside the insulating layer 111. One end portion in the Z1 direction of the conductor 120_5 is electrically coupled to the electrode 211w5 of the circuit chip 20 via the conductor 105, the interconnect layer 106, the conductor 107, the interconnect layer 108, the conductor 109, and the electrode 110w5. One end portion in the Z1 direction of the conductors 120_6 is not coupled to the conductor 105.

The conductor 105, the interconnect layer 106, the conductor 107, the interconnect layer 108, the conductor 109, the electrode 110w5, and the electrode 211w5, which are electrically coupled to the conductor 120_5, may form a square ring shape surrounding the wall region WR. The electrodes 110w5 and 211w5 function as bonding pads BPw5.

In the outer peripheral region OR of the circuit chip 20, the electrode 211w5 provided in the same layer as the insulating layer 213 is coupled to the semiconductor substrate 201 via the conductor 210, the interconnect layer 209, the conductor 208, the interconnect layer 207, the conductor 206, the interconnect layer 205, and the conductor 204.

2. Second Embodiment

Next, a second embodiment will be described. In the second embodiment, arrangement of bonding pads BPa in an element region ER will be described. Hereinafter, differences from the first embodiment will be mainly explained.

2. 1 Planar Configuration of Semiconductor Device

First, an example of a planar configuration of a semiconductor device 1 will be described with reference to FIG. 21. FIG. 21 is a plan view of the semiconductor device 1. In the example of FIG. 21, bonding pads BP are partly shown to explain each region.

As shown in FIG. 21, a peripheral circuit region PR includes an inner region PiR and an outer region PoR. The inner region PiR surrounds a core region CR. For example, the inner region PiR is a square ring-shaped region. The outer region PoR is a region interposed between the inner region PiR and a wall region WR. The outer region PoR surrounds the inner region PiR. For example, the outer region PoR is a square ring-shaped region. An external connection terminal to supply power to the semiconductor device 1 is provided in the outer region PoR. The outer region PoR has a width Wp. The outer region PoR is a region having the width Wp from the wall region WR (more specifically, from the bonding pad BPw2) toward the center of the semiconductor device 1. The width Wp is, for example, 30 μm or less.

Active pad regions AR1 and AR2 and dummy pad regions DAR and DR are provided on a bonding surface in an element region ER including the core region CR, the inner region PiR, and the outer region PoR.

More specifically, the bonding surface in the core region CR and the inner region PiR includes the active pad region AR1 and the dummy pad region DAR. Bonding pads BPa are arranged in the active pad region AR1. The dummy pad region DAR surrounds the active pad region AR1. For example, the dummy pad region DAR is a square ring-shaped region. Bonding pads BPdi are arranged in the dummy pad region DAR.

The active pad region AR2 is provided on the bonding surface in the outer region PoR. In the active pad region AR2, at least three bonding pads BPa coupled in common to one external connection terminal (power supply terminal) are arranged. In other words, a plurality of bonding pads BPa in the active pad region AR2 are coupled in common to the power supply terminal and function as a path of a power supply. No dummy pad region DAR is provided around the active pad region AR2.

In this embodiment, regions on the bonding surface in the element region ER that exclude the active pad regions AR1 and AR2 and the dummy pad regions DAR is referred to as the dummy pad regions DR.

The coverage of the bonding pads BPa in the active pad region AR1 is greater than the coverage of the bonding pads BPa in the active pad region AR2. The coverage of the bonding pads BPa in the active pad region AR1 is approximately equal to the coverage of the bonding pads BPdi in the dummy pad regions DAR. The coverage of the bonding pads BPa in the active pad region AR1 and the coverage of the bonding pads BPdi in the dummy pad regions DAR are higher than the coverage of the bonding pads BPdi in the dummy pad regions DR.

The coverage of the bonding pads BPa in the active pad region AR2 is designed so as to be less than ±5% of the coverage of the bonding pads BPdi in the adjacent dummy pad region DR. In other words, in the element region ER, in a case where the active pad region AR2 is provided within 30 μm from the bonding pad BPw2 (wall region WR), the coverage of the bonding pads BPa in the active pad region AR2 is assumed to be less than ±5% of the coverage of the bonding pads BPdi in the dummy pad region DR.

In this embodiment, the region having a width Wp (30 μm) or less from the bonding pad BPw2 is referred to as an outer region PoR. The coverage of the bonding pads BPa in the active pad region AR2 arranged in the outer region PoR is designed so as to be less than ±5% of the coverage of the bonding pads BPdi in the dummy pad regions DR. For example, if the coverage of the bonding pads BPa is ±5% or more of the coverage of the bonding pads BPdi in the outer region PoR, the step between the outer peripheral region OR and the element region ER may be increased during the CMP of the bonding surface. Furthermore, the step between the kerf region KR and the element region ER may be increased. Therefore, the possibility of the occurrence of a bonding failure in the bonding process is increased.

2. 2 Specific Example of Planar Layout of Bonding Surface

A specific example of a planar layout of the bonding surface will be described with reference to FIG. 22. FIG. 22 is a plan view of the bonding surface.

As shown in FIG. 22, a plurality of active pad regions AR1 are provided in the core region CR and the inner region PiR of the peripheral circuit region PR. A plurality of dummy pad regions DAR are provided to surround the respective active pad regions AR1. In the example shown in FIG. 22, the bonding surface in the core region CR is provided with an active pad region AR1 including the bonding pads BPa (electrodes 110a and 211a) arranged in a 3×7 arrangement, and an active pad region AR1 including the bonding pads BPa in a 1×2 arrangement. The bonding surface in the inner region PiR is provided with an active pad region AR1 including the bonding pads BPa in a 1×2 arrangement. In each active pad region AR1, the plurality of bonding pads BPa are arranged in a square grid pattern. Similarly to the bonding pads BPa, the bonding pads BPdi (electrodes 110di and 211di) in the dummy pad region DAR surrounding the active pad region AR1 are arranged in a square grid pattern.

A plurality of active pad regions AR2 are provided in the outer region PoR of the peripheral circuit region PR. In the example shown in FIG. 22, the bonding surface in the outer region PoR is provided with an active pad region AR2 including the bonding pads BPa (electrodes 110a and 211a) arranged in a 1×3 arrangement, an active pad region AR2 including the bonding pads BPa arranged in an 8×3 arrangement, and an active pad region AR2 including the bonding pads BPa in a 2×8 arrangement. In each active pad region AR2, the plurality of bonding pads BPa arranged inside the region are coupled to be at an equal electric potential. In each active pad region AR2, the plurality of bonding pads BPa are arranged in a square grid pattern. The distance between the bonding pads BPa in the active pad region AR2 is longer than that between the bonding pads BPa in the active pad region AR1.

In the dummy pad regions DR in the element region ER including the core region CR, the inner region PiR, and the outer region PoR, the bonding pads BPdi (electrodes 110di and 211di) are arranged in the staggered arrangement.

Similarly to the first embodiment, the wall region WR is provided with bonding pads BPw2 and BPw3. For example, the bonding pads BPw2 and BPw3 each have an approximately square ring-shaped structure similarly to the first embodiment. As in the first modification of the first embodiment, the bonding pads BPw2 and BPw3 may or may not have a continuous ring structure.

In the outer peripheral region OR, a plurality of bonding pads BPdo are arranged in the staggered arrangement.

In this embodiment, no bonding pad BPdk is provided in the kerf region KR.

2. 3 Arrangement Pattern and Coverage of Bonding Pads BPa

Next, an arrangement pattern and coverage of bonding pads BPa will be described.

2. 3. 1 Arrangement Pattern and Coverage of Bonding Pads BPa in Active Pad Region AR1

First, an arrangement pattern and a coverage of the bonding pads BPa in the active pad region AR1 will be described with reference to FIG. 23. FIG. 23 is a plan view showing an example of a planar layout of the bonding pads BPa in the active pad region AR1 and the bonding pads BPdi in the dummy pad region DAR. In the example shown in FIG. 23, for simplicity of the explanation, the element region ER is divided in a square grid pattern into square cells having a length L on each side. In this example, a bonding pad BPa is arranged to correspond to one square cell. However, the bonding pad BPa is not necessarily arranged to correspond to one square cell.

As shown in FIG. 23, for example, the bonding pad BPa is arranged to correspond to one square cell. In this case, the area of the bonding pad BPa is $L^2$. The shape of the bonding pad BPa on the XY plane is not necessarily a square.

In the active pad region AR1 of 5 cells by 5 cells (5L×5L), for example, 9 bonding pads BPa are arranged at every other two cells in a 3×3 square grid pattern. In the example shown in FIG. 23, the bonding pads BPa are arranged at regular intervals, but the arrangement is not limited thereto. Since the arrangement of the bonding pads BPa depends on the arrangement of the interconnect layers and the arrangement of the contact plugs to be coupled thereto, the bonding pads BPa are not necessarily arranged at regular intervals.

Similarly, in the dummy pad region DAR surrounding the active pad region AR1, 40 bonding pads BPdi are arranged at every other cell in a square grid pattern.

The coverage of the bonding pads BPa in the active pad region AR1 is calculated as, for example, a ratio of the area occupied by the bonding pads BPa to the area of the active pad region AR1. The coverage of the bonding pads BPdi in the dummy pad region DAR is calculated as, for example, a ratio of the area occupied by the bonding pads BPdi to the area of the dummy pad region DAR.

2. 3. 2 Arrangement Pattern and Coverage of Bonding Pads BPa in Active Pad Region AR2

Next, an arrangement pattern and a coverage of the bonding pads BPa in the active pad region AR2 will be described with reference to FIG. 24. FIG. 24 is a plan view showing an example of a planar layout of bonding pads BPa in the active pad region AR2.

As shown in FIG. 24, in the active pad region AR2 of 11 cells by 11 cells (11L×11L), for example, 9 bonding pads BPa are arranged at every other five cells in a 3×3 square grid pattern. In the example shown in FIG. 24, similarly to the example of FIG. 23, the bonding pads BPa are arranged at regular intervals, but the arrangement is not limited thereto. The bonding pads BPa are not necessarily arranged at regular intervals.

The coverage of the bonding pads BPa in the active pad region AR2 is calculated as, for example, a ratio of the area occupied by the bonding pads BPa to the area of the active pad region AR2.

2. 4 Cross-Sectional Structure of Semiconductor Device

Next, an example of a cross-sectional structure of the semiconductor device 1 will be described. FIG. 25 is a cross-sectional view showing an example of the cross-sectional structure of the semiconductor device 1.

As shown in FIG. 25, the structures of the core region CR, the wall region WR, and the outer peripheral region OR are the same as those of the first embodiment shown in FIG. 9.

The peripheral circuit region PR of the array chip 10 will be described. The outer region PoR of the array chip 10 includes an external connection terminal region BR provided for a power supply. A plurality of conductors 130 are coupled to an interconnect layer 116 functioning as an external connection terminal. For example, the conductors 130 coupled to the interconnect layer 116 are coupled in the Z1 direction to one interconnect layer 106. The interconnect layer 106 is electrically coupled to a plurality of electrodes 110a via a plurality of sets of a conductor 107, an interconnect layer 108, and a conductor 109. The electrodes 110a are respectively in contact with the corresponding electrodes 211a of the circuit chip 20. The plurality of bonding pads BPa coupled in common to one interconnect layer 116 are arranged in a single active pad region AR2.

In the outer region PoR of the circuit chip 20, the plurality of electrodes 211a corresponding to the single active pad region AR2 are coupled in common to, for example, one interconnect layer 209 via the respective conductors 210. The interconnect layer 209 is electrically coupled to a semiconductor substrate 201 via a conductor 208, an interconnect layer 207, a conductor 206, an interconnect layer 205, and a conductor 204.

In this embodiment, the kerf region KR does not include the electrodes 110dk and 211dk of the first embodiment described above with reference to FIG. 9.

2. 5 Advantageous Effects of Present Embodiment

With the configuration of the present embodiment, the coverage of the bonding pads BPa arranged in the outer region PoR within the width Wp (30 µm) or less from the bonding pad BPw2 of the wall region WR can be designed to be less than ±5% of the coverage of the bonding pads BPdi in the dummy pad regions DR. Thus, the step between the element region ER and the outer peripheral region OR or the kerf region KR on the bonding surface can be reduced, and the occurrence of a bonding failure in the bonding process can be suppressed. Therefore, the manufacturing yield of the semiconductor device 1 can be improved.

2. 6 Modification of Second Embodiment

Next, a modification of the second embodiment will be described with reference to FIG. 26. FIG. 26 is a plan view of the bonding surface.

As shown in FIG. 26, bonding pads BPdk may be arranged in the kerf region KR similarly to the first embodiment. In this modification, the same advantageous effect as in the first embodiment can be obtained.

3. Modifications, Etc.

According to the above embodiment, the semiconductor device (1) includes a first chip (20) including a substrate (201), and a second chip (10) bonded to the first chip at a first surface (bonding surface). Each of the first chip and the second chip includes an element region (ER), and an end region (KR) including a chip end portion. The first chip includes a plurality of first electrodes (211dk) that are arranged on the first surface in the end region and are in an electrically uncoupled state. The second chip includes a plurality of second electrodes (110dk) that are arranged on the first surface in the end region, are in an electrically uncoupled state, and are respectively in contact with the first electrodes.

The manufacturing yield of the semiconductor device 1 can be improved by applying the above embodiments.

The embodiments are not limited to the above-described aspect, and can be modified in various ways.

Furthermore, the term "couple" in the above-described embodiments also includes the state of indirect coupling with other components, such as a transistor and a resistor, interposed therebetween.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first chip including a substrate; and
a second chip bonded to the first chip at a first surface, wherein
each of the first chip and the second chip includes an element region, and an end region including a chip end portion,
the first chip includes a plurality of first electrodes that are arranged on the first surface in the end region and are in an electrically uncoupled state,
the second chip includes a plurality of second electrodes that are arranged on the first surface in the end region, are in an electrically uncoupled state, and are respectively in contact with the first electrodes,
each of the first chip and the second chip further includes a first ring-shaped region arranged between the element region and the end region,
the first chip further includes in the first ring-shaped region:
a third electrode that is arranged on the first surface and is electrically coupled to a first substrate region; and
a fourth electrode that is arranged on the first surface and is electrically coupled to a second substrate region, and
the second chip further includes in the first ring-shaped region:
a first conductor surrounding the element region;
a second conductor surrounding the first conductor;
a fifth electrode that is arranged on the first surface, is electrically coupled to the first conductor, and is in contact with the third electrode; and
a sixth electrode that is arranged on the first surface, is electrically coupled to the second conductor, and is in contact with the fourth electrode.

2. The semiconductor device according to claim 1, wherein the first electrodes occupy an area of 5% or more and 15% or less of an area of the first surface in the end region.

3. The semiconductor device according to claim 1, wherein the first electrodes are arranged in a first direction and a second direction on the first surface in the end region, the first direction and the second direction intersecting at an angle smaller than 90 degrees.

4. The semiconductor device according to claim 1, wherein one end of the first conductor is electrically coupled to one end of the second conductor.

5. The semiconductor device according to claim 1, wherein at least one of the third electrode and the fourth electrode has a ring shape.

6. The semiconductor device according to claim 1, wherein the end region includes:
an electrode arrangement region in which the first electrodes and the second electrodes are arranged; and
an outermost edge region surrounding the electrode arrangement region and including no electrode.

7. The semiconductor device according to claim 1, wherein the first surface in the element region is provided with a first region and a second region surrounding the first region, the first chip further includes:

a plurality of seventh electrodes that are provided in the first region and are electrically coupled to the substrate; and a plurality of eighth electrodes that are provided in the second region and are in an electrically uncoupled state, and the second chip further includes:

a plurality of ninth electrodes that are provided in the first region and are respectively in contact with the seventh electrodes; and a plurality of tenth electrodes that are provided in the second region, are in an electrically uncoupled state, and are respectively in contact with the eighth electrodes.

8. The semiconductor device according to claim 1, wherein each of the first chip and the second chip further includes a second ring-shaped region arranged between the first ring-shaped region and the end region, the first chip further includes an eleventh electrode arranged on the first surface in the second ring-shape region, and the second chip further includes in the second ring-shaped region:

a third conductor surrounding the second conductor; and a twelfth electrode that is arranged on the first surface, is electrically coupled to the third conductor, and is in contact with the eleventh electrode.

9. The semiconductor device according to claim 1, wherein the end region includes a gate insulating film provided on the substrate and a gate electrode provided on the gate insulating film.

10. The semiconductor device according to claim 1, wherein the first chip further includes a row decoder and a sense amplifier provided in the element region, and the second chip further includes a memory cell array that is provided in the element region and is electrically coupled to the row decoder and the sense amplifier.

11. A semiconductor device comprising:

a first chip including a substrate; and a second chip bonded to the first chip at a first surface, wherein each of the first chip and the second chip includes an element region including a first region and a second region surrounding the first region, and a third region surrounding the element region, the first surface in the second region is provided with a fourth region and a fifth region, the first chip further includes:

a plurality of first electrodes that are arranged in the fourth region and are electrically coupled to the substrate; and a plurality of first dummy electrodes arranged in the fifth region in an electrically uncoupled state, the second chip further includes:

a plurality of second electrodes that are arranged in the fourth region, are electrically coupled to an external connection terminal, and are respectively in contact with the first electrodes; and

a plurality of second dummy electrodes that are arranged in the fifth region in an electrically uncoupled state, and are respectively in contact with the first dummy electrodes, and the first electrodes occupy an area of the fourth region at a first ratio and the first dummy electrodes occupy an area of the fifth region at a second ratio, the first ratio and the second ratio differing by 5% or less.

12. The semiconductor device according to claim 1, wherein the first substrate region is formed of a first diffusion region provided in the substrate, and the second substrate region is formed of a second diffusion region separately provided from the first diffusion region in the substrate.

13. The semiconductor device according to claim 11, wherein the second electrodes in the fourth region are three or more and are coupled to the external connection terminal at an equal potential.

14. The semiconductor device according to claim 11, wherein the second region has a width of 30 μm or less between the first region and the third region.

15. The semiconductor device according to claim 11, wherein the first chip further includes in the third region:

a first diffusion region of a first conductivity type provided in the substrate;

a second diffusion region of a second conductivity type provided in the substrate, the second conductivity type being different from the first conductivity type;

a third electrode that is arranged on the first surface and is electrically coupled to the first diffusion region; and a fourth electrode that is arranged on the first surface and is electrically coupled to the second diffusion region, and the second chip further includes in the third region:

a first conductor surrounding the element region;

a second conductor surrounding the first conductor;

a fifth electrode that is arranged on the first surface, is electrically coupled to the first conductor, and is in contact with the third electrode; and a sixth electrode that is arranged on the first surface, is electrically coupled to the second conductor, and is in contact with the fourth electrode.

16. The semiconductor device according to claim 11, wherein the first surface in the first region is provided with a sixth region, a seventh region surrounding the sixth region, and an eighth region surrounding the seventh region, the first chip further includes:

a plurality of seventh electrodes that are arranged in the sixth region and are electrically coupled to the substrate;

a plurality of third dummy electrodes that are arranged in the seventh region in an electrically uncoupled state; and a plurality of fourth dummy electrodes that are arranged in the eighth region in an electrically uncoupled state, and the second chip further includes:

a plurality of eighth electrodes that are arranged in the sixth region and are respectively in contact with the seventh electrodes;

a plurality of fifth dummy electrodes that are arranged in the seventh region in an electrically uncoupled state, and are respectively in contact with the third dummy electrodes; and a plurality of sixth dummy electrodes that are arranged in the eighth region in an electrically uncoupled state, and are respectively in contact with the fourth dummy electrodes.

17. The semiconductor device according to claim 16, wherein the seventh electrodes occupy an area of the sixth region at a third ratio, the third ratio being higher than the first ratio.

18. The semiconductor device according to claim 17, wherein the third dummy electrodes occupy an area of the seventh region at a fourth ratio, the fourth ratio being approximately equal to the third ratio.

19. The semiconductor device according to claim 18, wherein the fourth dummy electrodes occupy an area of the eighth region at a fifth ratio, the fourth ratio being higher than the fifth ratio.

20. The semiconductor device according to claim 19, wherein the fifth ratio is approximately equal to the second ratio.

\* \* \* \* \*